United States Patent
Scarbrough et al.

(10) Patent No.: US 12,315,813 B2
(45) Date of Patent: May 27, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); Jordan D. Greenlee, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 578 days.

(21) Appl. No.: 17/702,160

(22) Filed: Mar. 23, 2022

(65) Prior Publication Data
US 2023/0307368 A1 Sep. 28, 2023

(51) Int. Cl.
*H01L 23/535* (2006.01)
*H10B 41/27* (2023.01)
*H10B 43/27* (2023.01)

(52) U.S. Cl.
CPC .......... *H01L 23/535* (2013.01); *H10B 41/27* (2023.02); *H10B 43/27* (2023.02)

(58) Field of Classification Search
CPC ....... H01L 23/535; H10B 41/27; H10B 43/27; H10B 43/10; H10B 43/40
See application file for complete search history.

(56) References Cited

U.S. PATENT DOCUMENTS

| | | | |
|---|---|---|---|
| 9,230,987 B2* | 1/2016 | Pachamuthu | .......... H10B 63/84 |
| 9,331,094 B2 | 5/2016 | Hada | |
| 9,437,606 B2 | 9/2016 | Makala et al. | |
| 9,627,405 B1 | 4/2017 | Lee | |
| 10,224,340 B2 | 3/2019 | Hada et al. | |
| 10,381,372 B2 | 8/2019 | Amano et al. | |
| 10,468,413 B2 | 11/2019 | Takuma et al. | |
| 10,720,442 B2 | 7/2020 | Huang et al. | |
| 11,721,727 B2 | 8/2023 | Baraskar et al. | |
| 2020/0312868 A1 | 10/2020 | Xiao | |

(Continued)

OTHER PUBLICATIONS

U.S. Appl. No. 17/583,472, filed Jan. 25, 22, by Scarbrough et al.

(Continued)

*Primary Examiner* — Karen Kusumakar
*Assistant Examiner* — Shawn Shaw Muslim
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAV constructions that individually extend through a lowest of the conductive tiers. The TAV constructions individually comprise an insulative lining having a lowest surface that is directly against metal material in the lowest conductive tier. Other embodiments, including method, are disclosed.

31 Claims, 21 Drawing Sheets

Fig. 37

(56) References Cited

U.S. PATENT DOCUMENTS

2021/0036109 A1    2/2021  Kim et al.
2021/0066460 A1    3/2021  Haller
2022/0157940 A1    5/2022  Hopkins et al.
2023/0200076 A1    6/2023  Liu et al.

OTHER PUBLICATIONS

U.S. Appl. No. 17/583,651, filed Jan. 25, 22, by Scarbrough et al.
U.S. Appl. No. 17/727,515, filed Apr. 22, 22, by Scarbrough et al.

\* cited by examiner

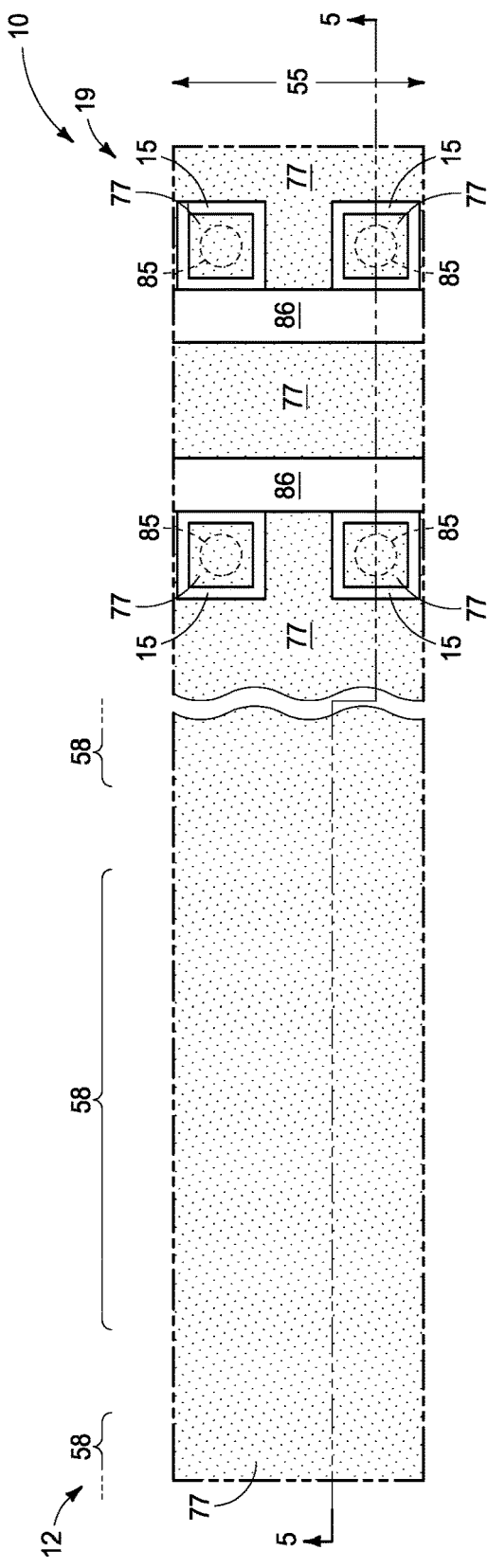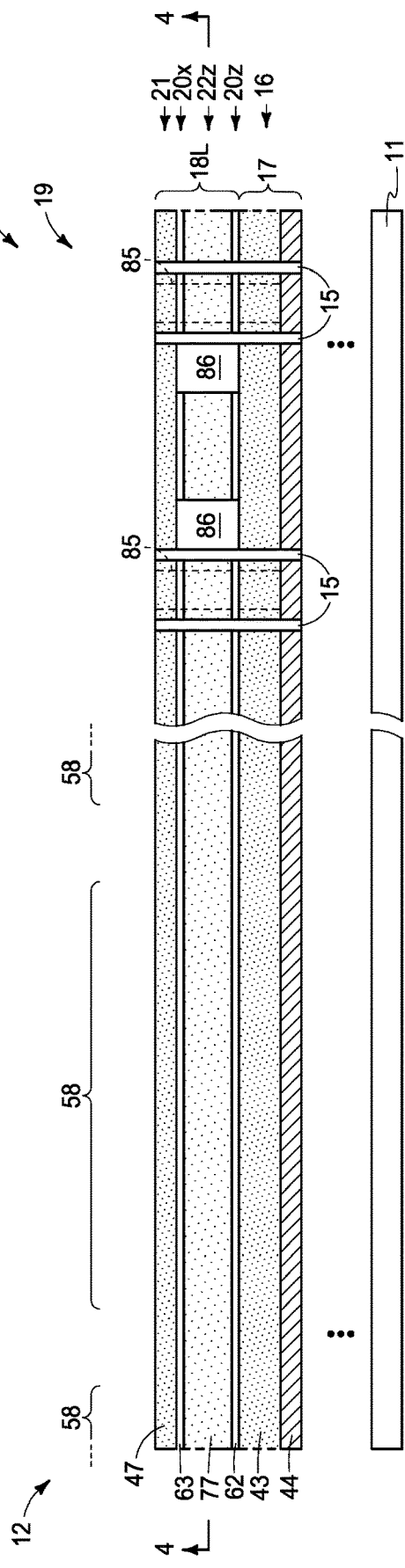

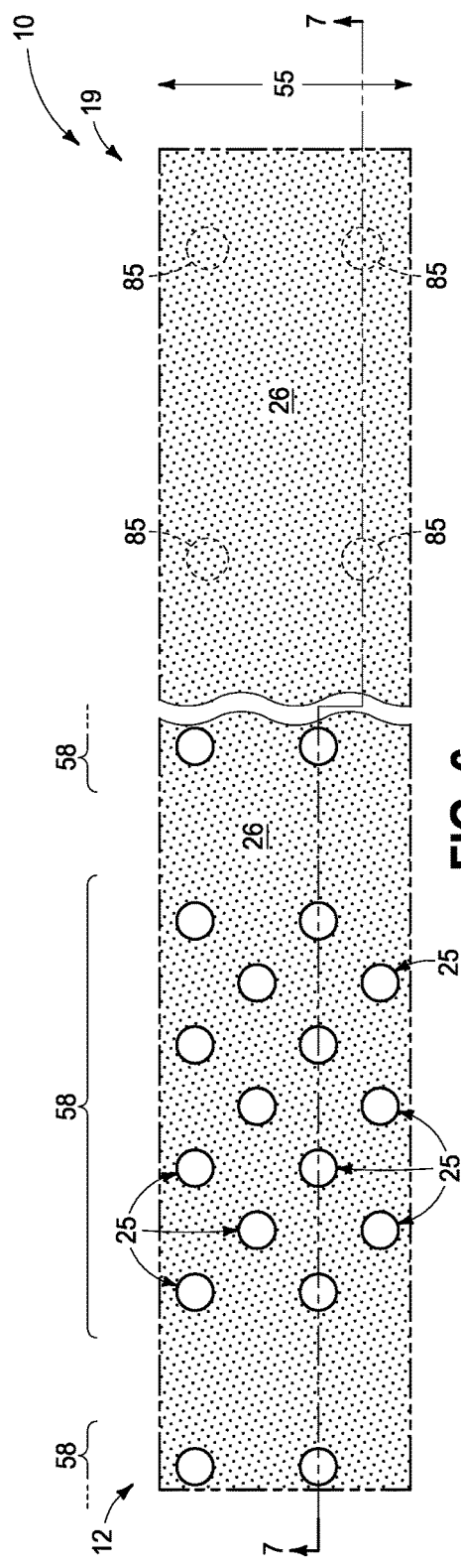
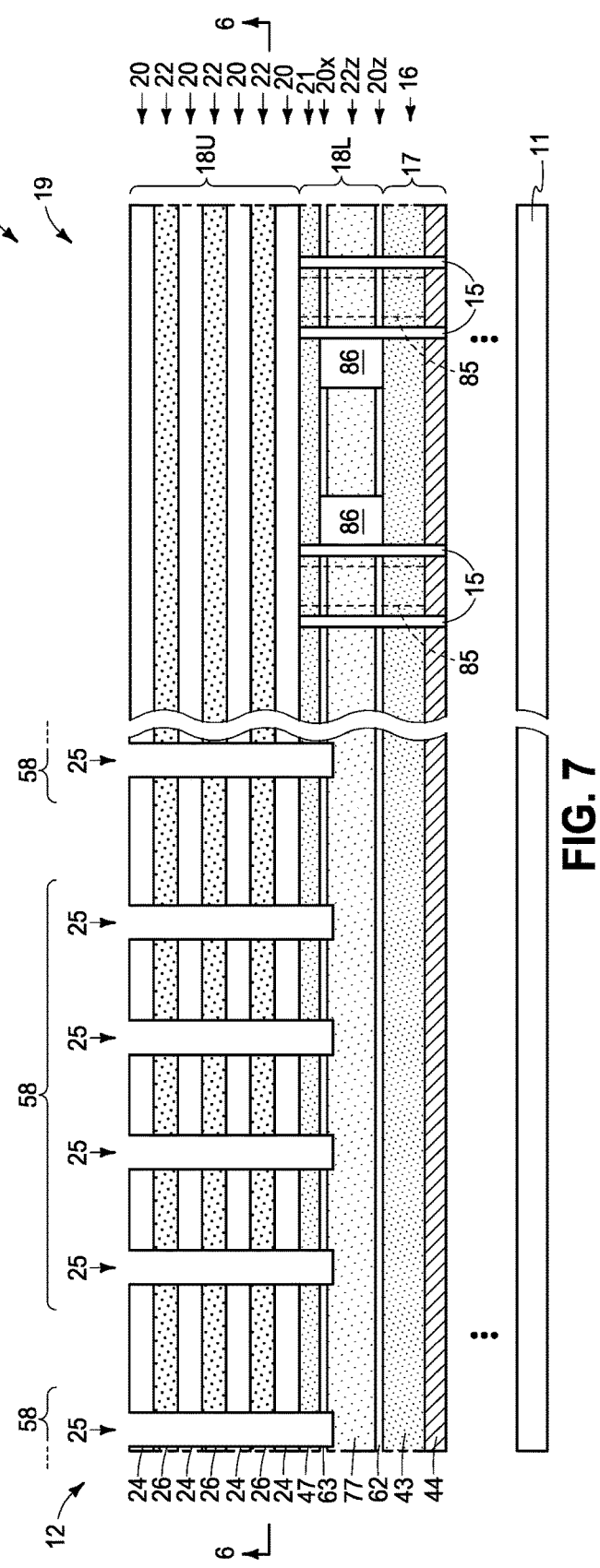

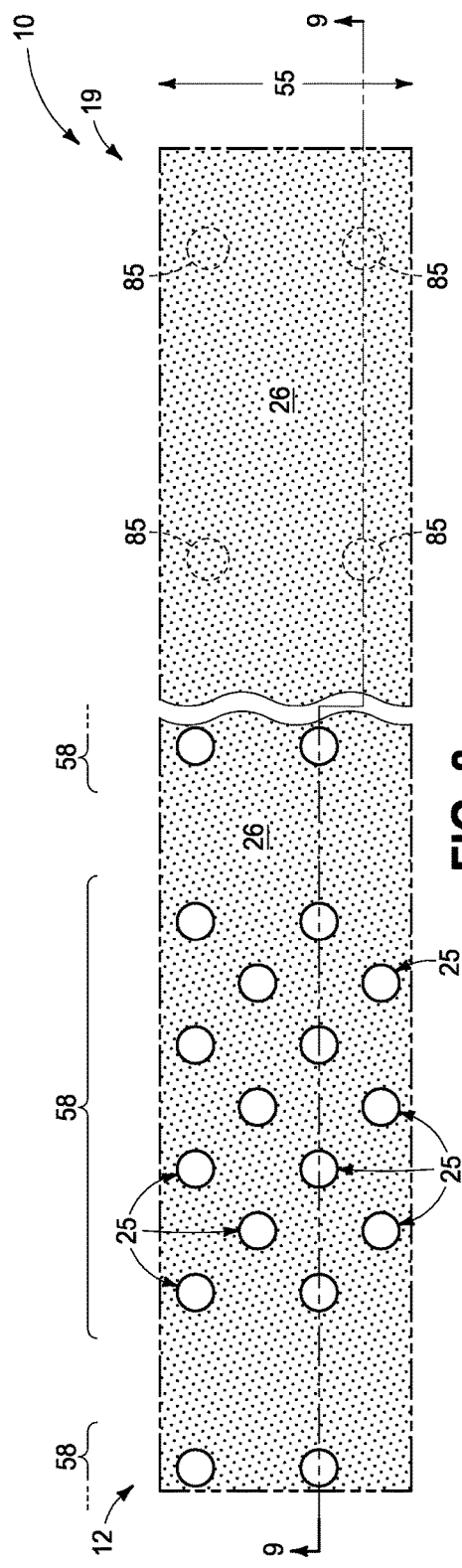
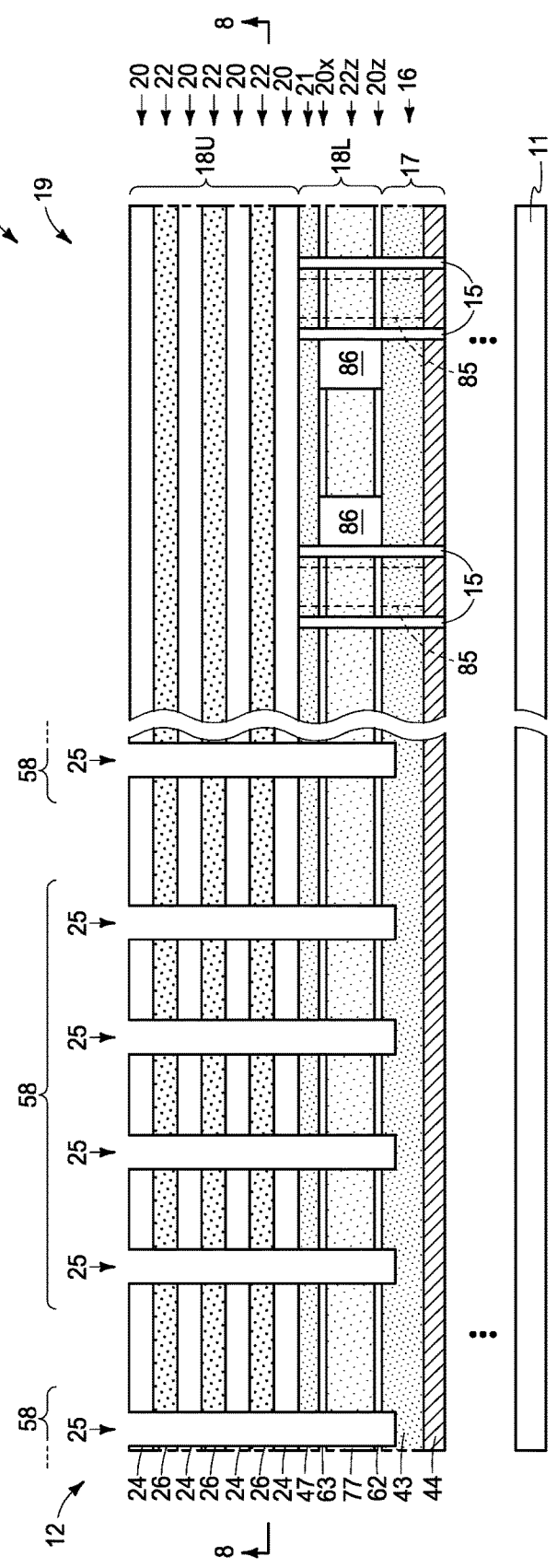

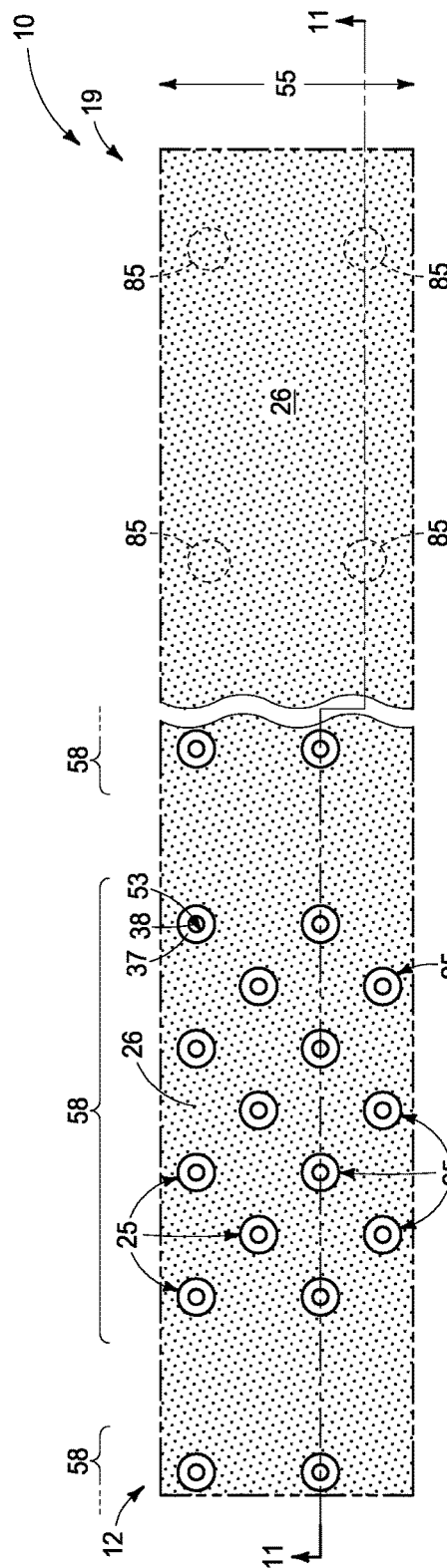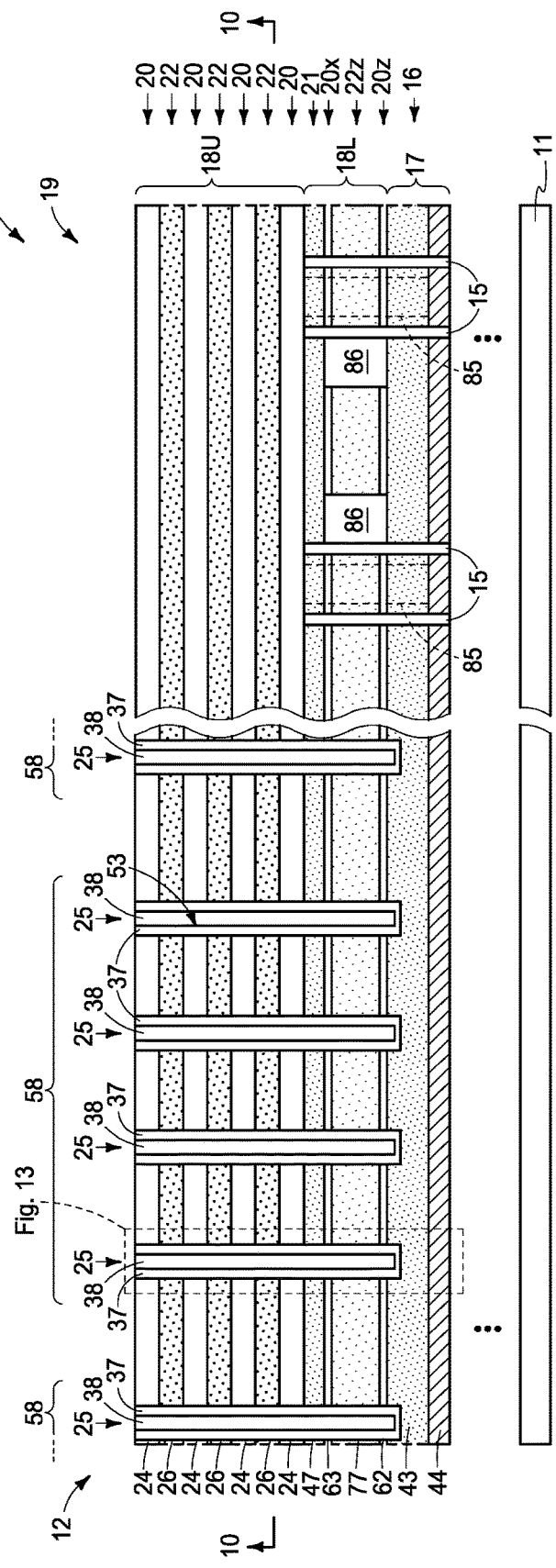

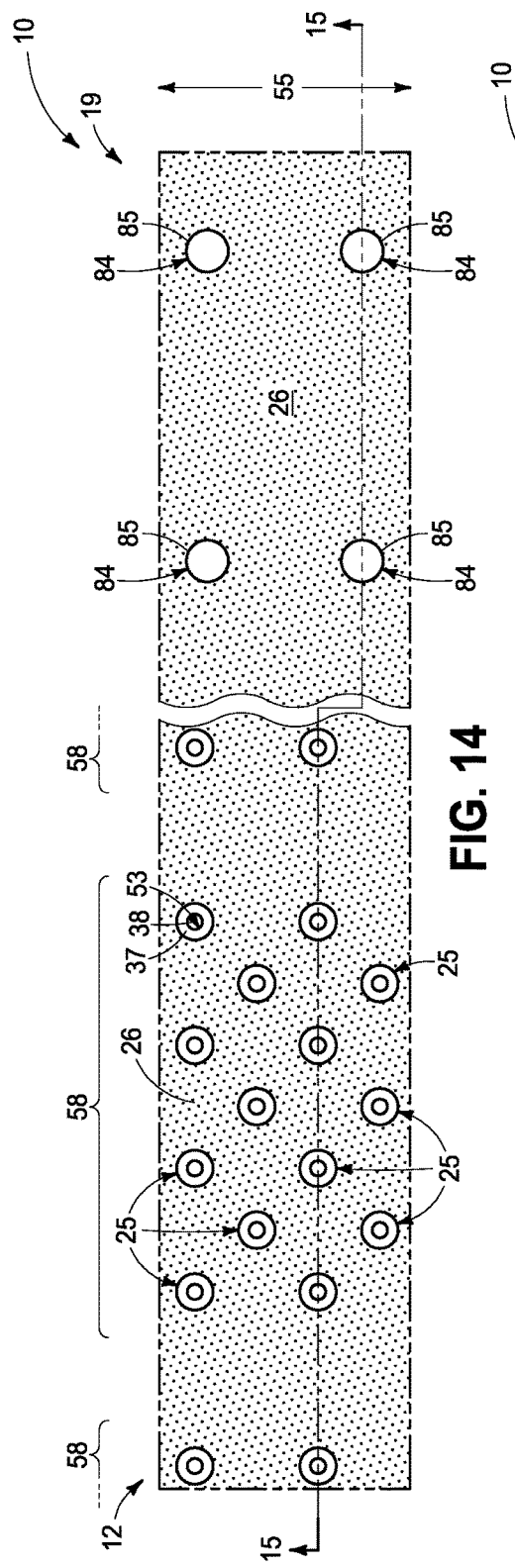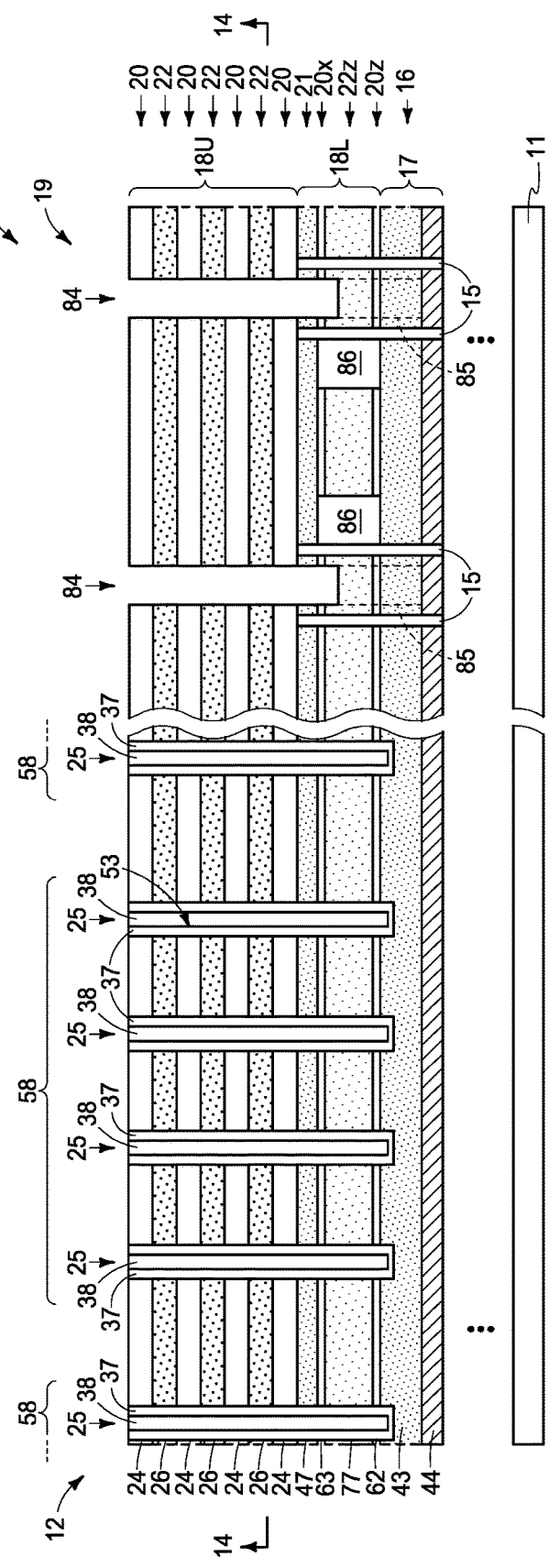

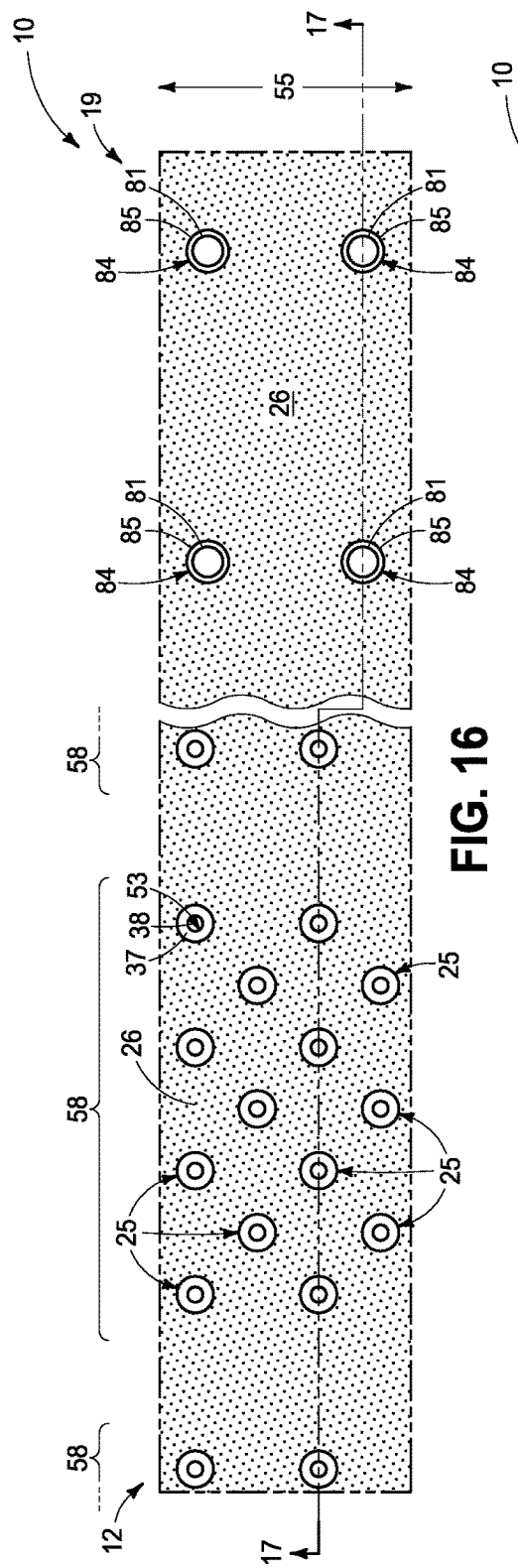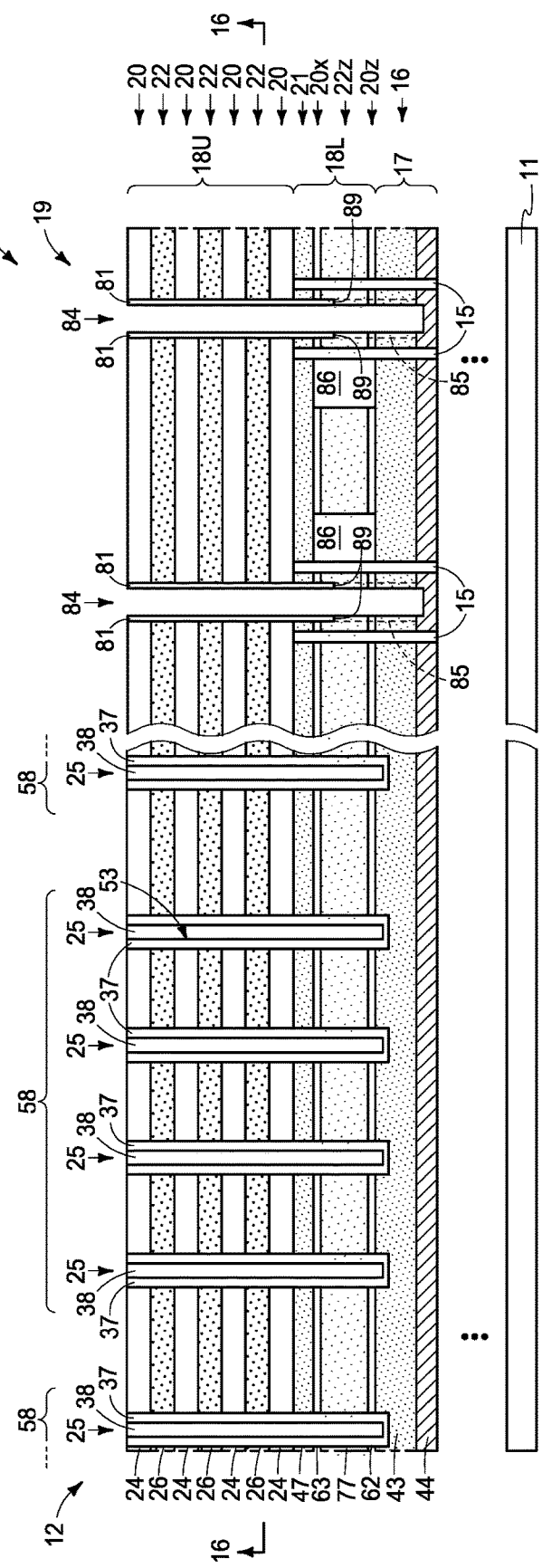

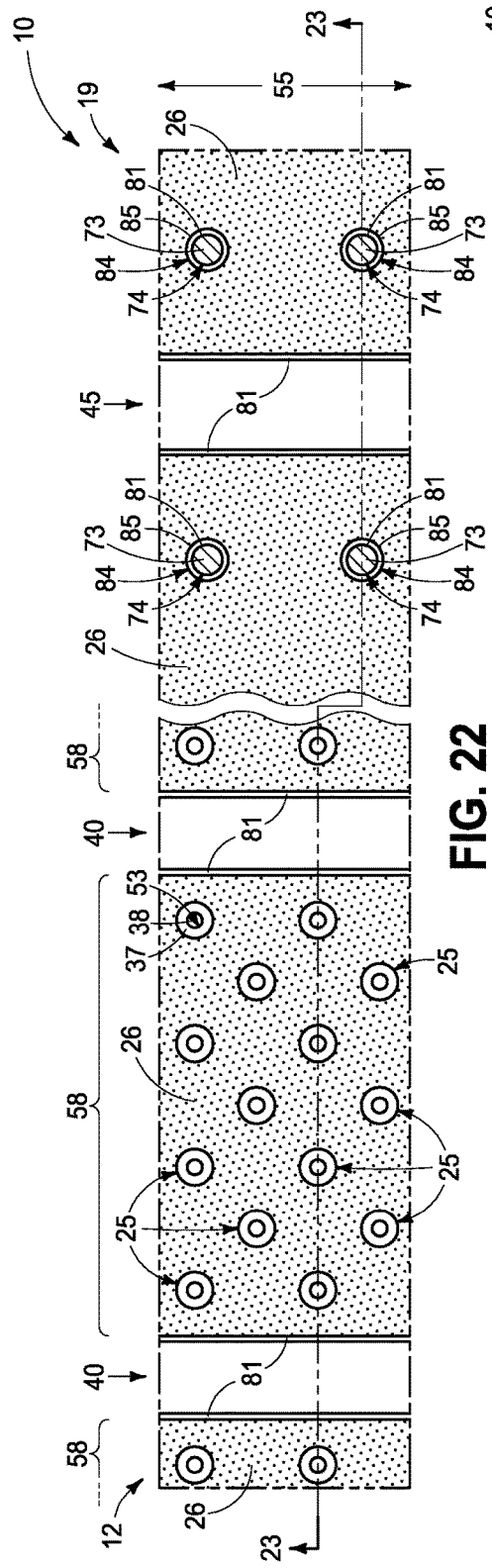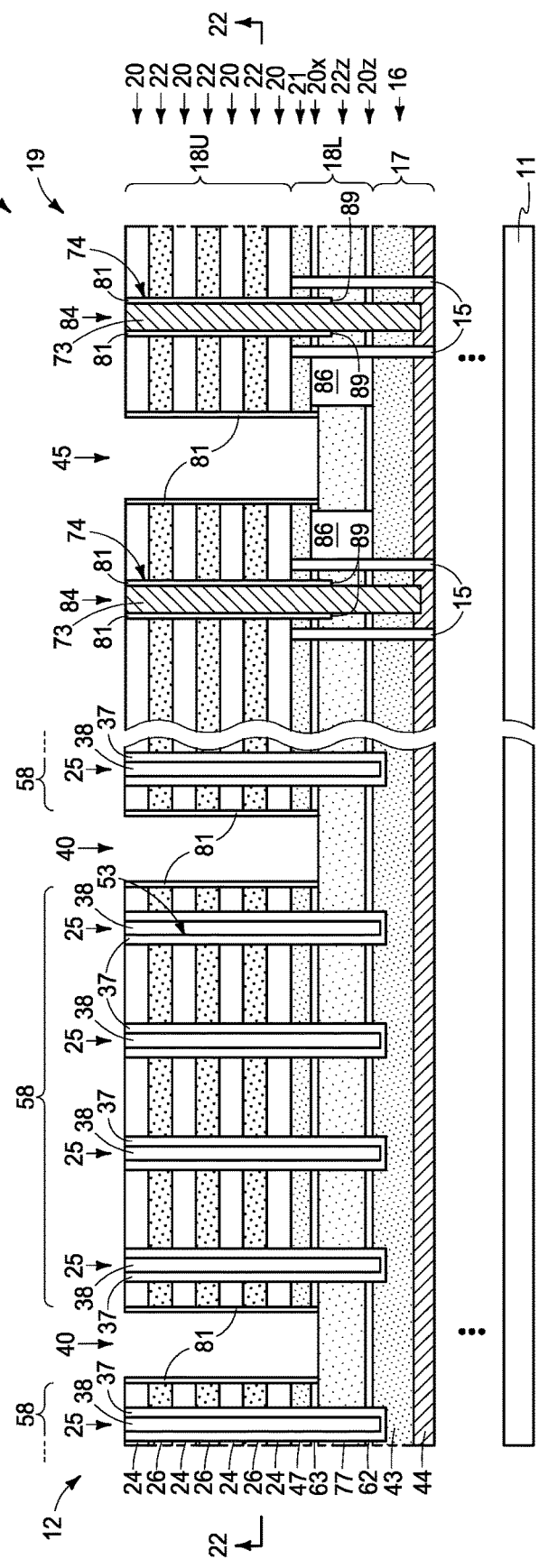

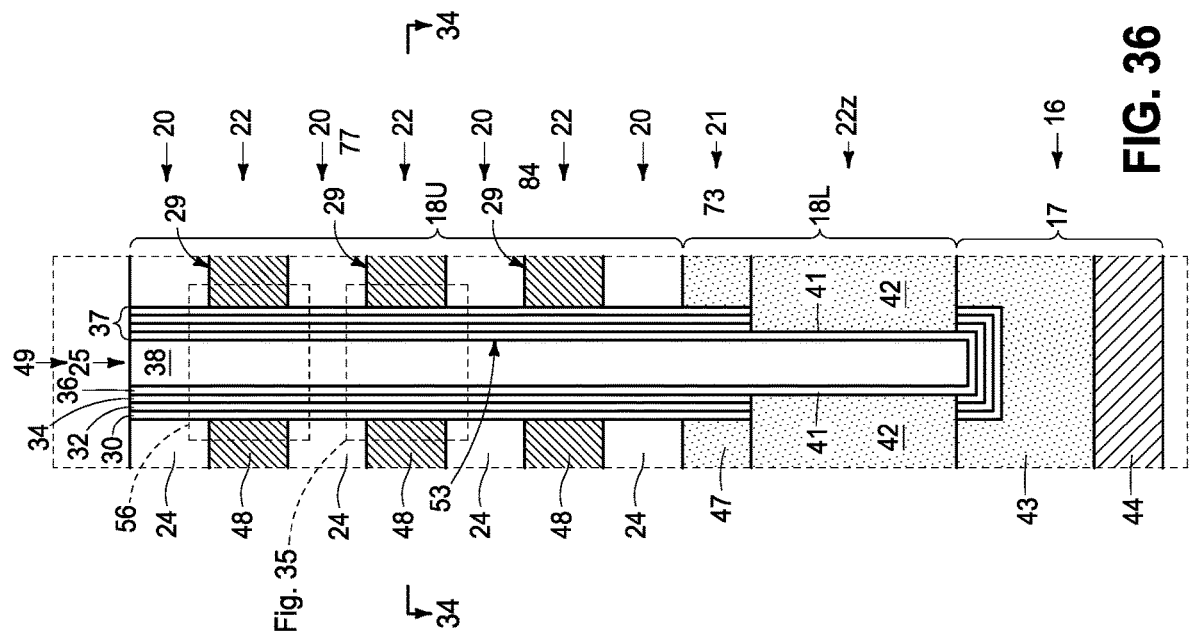
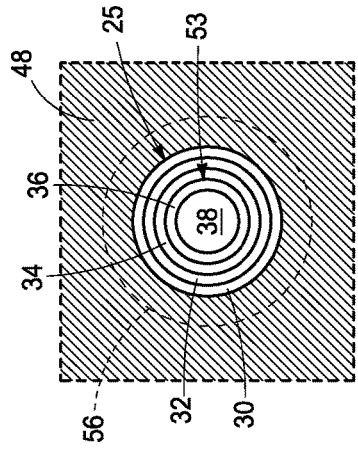
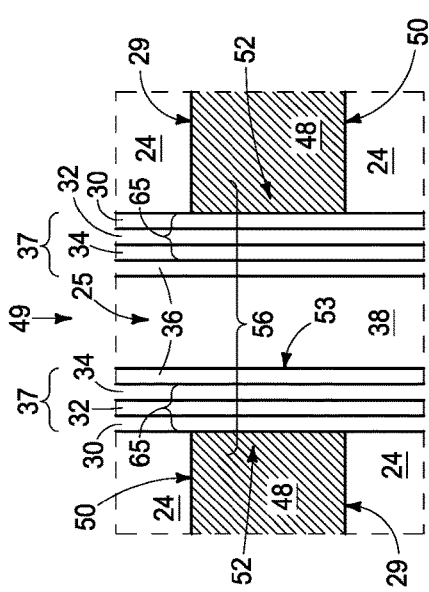

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

BRIEF DESCRIPTION OF THE DRAWINGS

FIGS. 4-39 are diagrammatic sequential sectional and/or enlarged views of the construction of FIGS. 2 and 3, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-39 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

Figure 1:
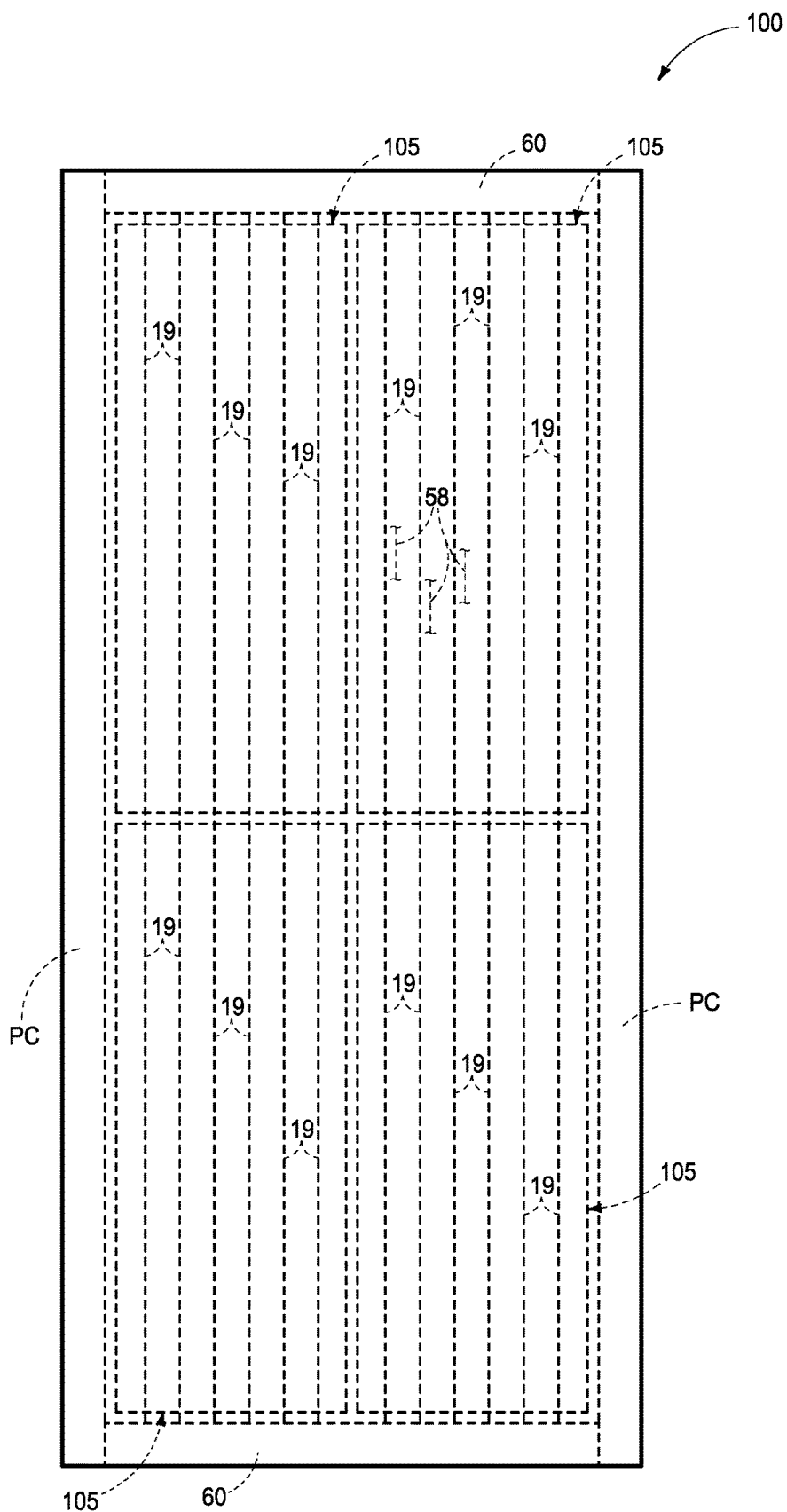
FIG. 1 is a diagrammatic top plan view of a die or die area that may be part of a larger substrate (e.g., a semiconductor wafer, and not shown).
Figure 2:
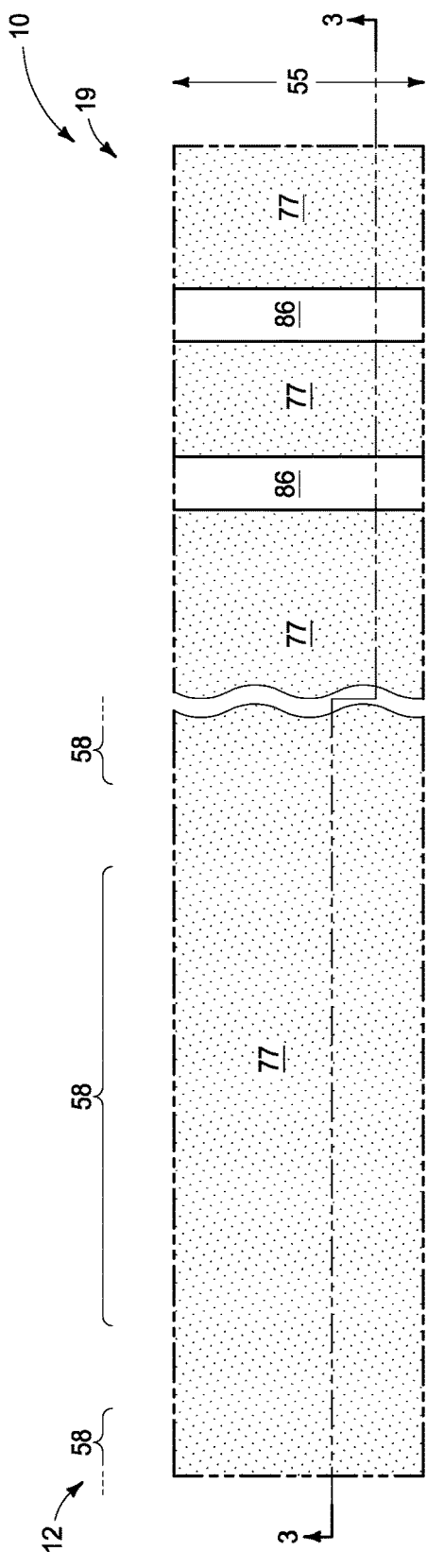
FIGS. 2 and 3 are diagrammatic cross-sectional views of portions of a construction (e.g., as part of FIG. 1) that will comprise an array of elevationally extending strings of memory cells in accordance with an embodiment of the invention.
Figure 3:
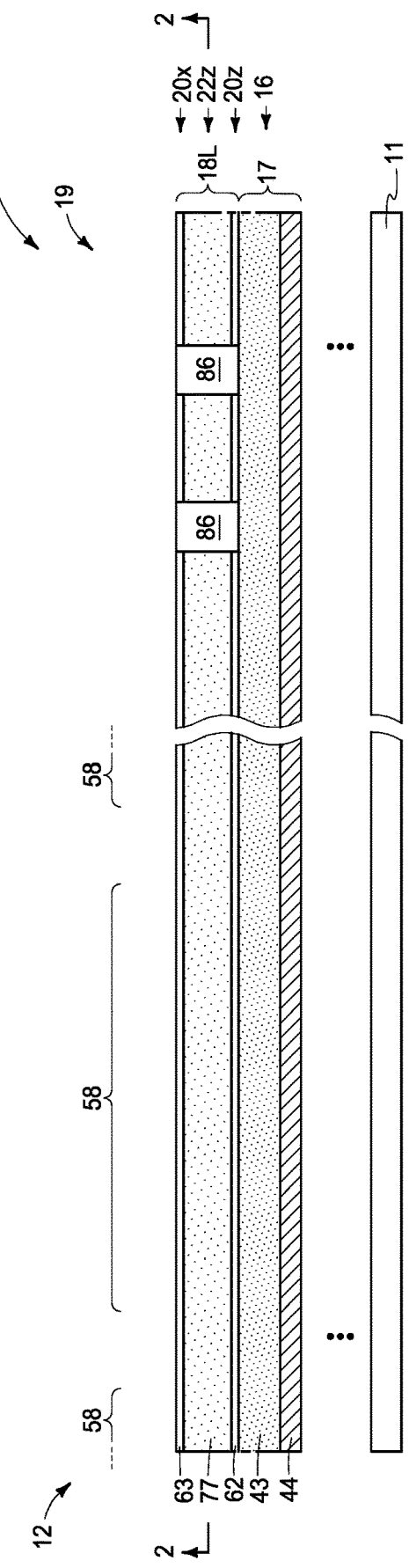
Figure 13:
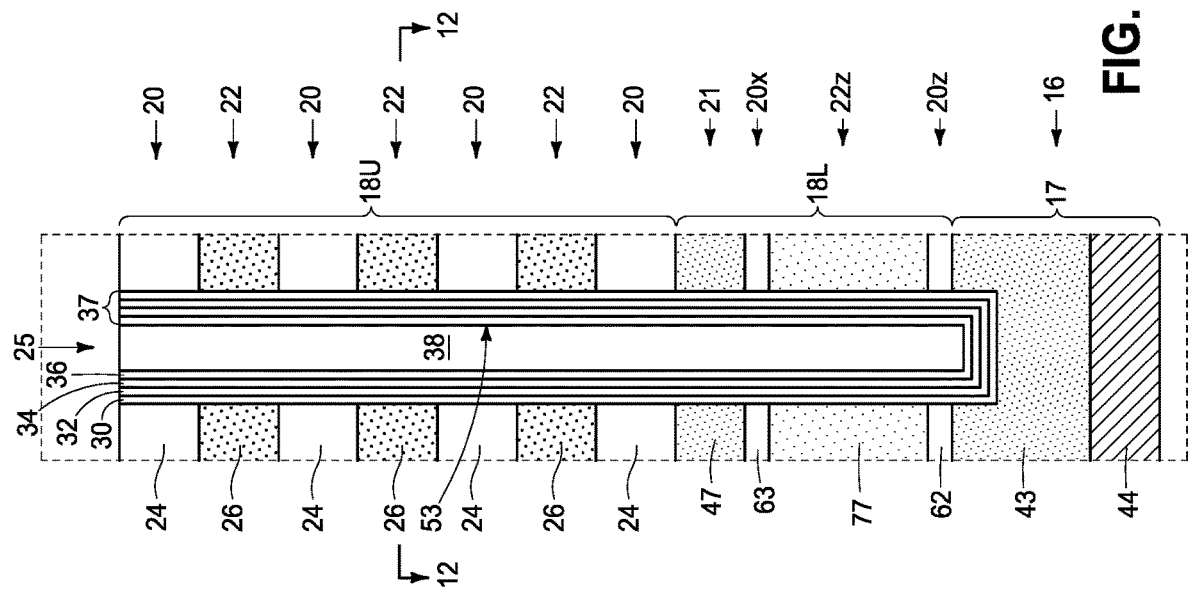
Figure 12:
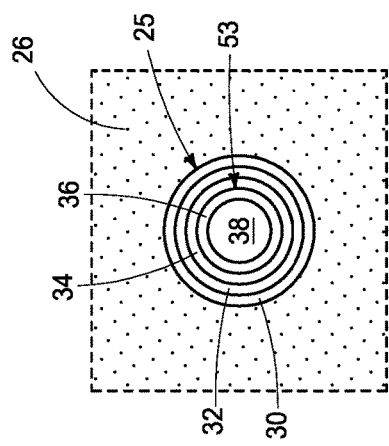

FIG. 1 shows an example diagrammatic embodiment comprising a die or die area 100 that may be part of a larger substrate (e.g., a semiconductor wafer, and not shown) and in which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2 and 3 are diagrammatic larger scale views of portions of die area 100.

Referring to FIGS. 2 and 3, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack and between electronic components at different elevations in a finished construction of integrated circuitry that has been or is being fabricated (e.g., through a stack 18* described below; an * being used as a suffix to be inclusive of all such same-numerically-designated components that may or may not have other suffixes). A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be in a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2 and 3-depicted materials. For example, other partially or wholly fabricated components of integrated circuitry may be provided somewhere above, about, or in base substrate 11. Control and/or other peripheral circuitry for operating components in an array (e.g., array 12 or memory-array region 12) of elevationally-extending strings of memory cells may also be fabricated and may or may not be wholly or partially in an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises conductive metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed in array 12.

A lower portion 18L of a stack 18* has been formed directly above conductor tier 16 and substrate 11. Stack 18* will comprise vertically-alternating conductive tiers 22* and insulative tiers 20*. Lower portion 18L and conductor tier 16 collectively comprise laterally-spaced memory-block regions 58 that will comprise laterally-spaced memory blocks 58 in a finished circuitry construction and comprise TAV region 19. Memory-block regions 58 and resultant memory blocks 58 (not yet shown) may be considered as being longitudinally elongated and oriented, for example horizontally-parallel relative one another, along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17.

Example lowest second tier 20z is insulative and may be sacrificial (e.g., in array region 12; e.g., comprising material 62, for example silicon dioxide and/or silicon nitride). A next-lowest second tier 20x of second tiers 20* is directly above lowest second tier 20z and may be sacrificial (e.g., in array region 12; e.g., comprising material 63, for example silicon dioxide and/or silicon nitride). A lowest tier 22z of first tiers 22* is vertically between lowest second tier 20z and next-lowest second tier 20x and comprises material 77 (e.g., polysilicon or silicon nitride).

In one embodiment, material 77 is sacrificial. In one embodiment, material 77 comprises metal material 77. The metal material may be insulative, conductive, and/or semiconductive. As examples, the metal material may comprise a metal oxide (e.g., an aluminum oxide, a tungsten oxide, a hafnium oxide, a hafnium aluminum oxide, a tantalum oxide, a titanium oxide, or other metal oxide). The metal material may comprise a metal nitride (e.g., a tungsten nitride, an aluminum nitride, a titanium nitride, a cobalt nitride, or other metal nitride). The metal material may comprise a metal silicide (e.g., a tungsten silicide, an aluminum silicide, a titanium silicide, a cobalt silicide, or other metal silicide). The metal material may comprise elemental-form metal (e.g., W, Co, Ti, or other metal element).

In one embodiment, a pair of laterally-spaced walls 86 have been formed in TAV region 19 and that extend vertically through lowest first tier 20z. Walls 86 are horizontally-elongated (e.g., along direction 55) along multiple horizontal locations 85 where individual TAVs will be formed (not-yet-shown), with none of multiple horizontal locations 85 being laterally-between laterally-spaced walls 86 of the pair. Example walls 86 are ideally of different composition from that of material 77, and may be any of insulative, conductive, or semiconductive. Examples include metal silicides, metal nitrides, silicon dioxide, silicon nitride, doped polysilicon undoped polysilicon, and carbon-containing material (e.g., carbon, carbon-doped material, a carbon nitride).

Referring to FIGS. 4 and 5, a conducting-material tier 21 comprising conducting material 47 (e.g., conductively-doped polysilicon) has been formed as part of lower portion 18L of stack 18*. Insulative material 15 (e.g., silicon dioxide, silicon nitride, and/or aluminum oxide) has thereafter been formed vertically through lower portion 18L of stack 18* in TAV region 19 circumferentially around horizontal locations 85 where individual TAVs will be formed. In one embodiment and as shown, insulative material 15 is formed through conductor tier 16.

Referring to FIGS. 6 and 7, an upper portion 18U of stack 18* has been formed directly above lower portion 18L of stack 18* and insulative material 15 (when present). Example upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown) or tier 21 may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

In one embodiment, channel openings 25 have been etched through upper portion 18U of stack 18* in laterally-spaced memory-block regions 58 using metal material 77 of lowest first tier 22z as an etch-stop during such etching. Channel openings 25 may taper radially-inward or radially-outward moving deeper into stack 18* (neither being shown).

Referring to FIGS. 8 and 9, in one embodiment after using metal material 77 as an etch-stop for the FIGS. 6 and 7 etching, channel openings 25 have been etched deeper into stack 18* (e.g., at least to conductor tier 16 using some different chemistry and/or conditions to etch through metal material 77). In some embodiments, channel openings 25 may go into conductor material 17 of conductor tier 16 (as shown) or may stop there-atop (not shown). Alternately, as an example, channel openings 25 may not so extend. A reason for extending channel openings 25 at least to conductor material 17 of conductor tier 16 is to provide an anchoring effect to material that is in channel openings 25. Etch-stop material (not shown) may be in or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

Referring to FIGS. 10-13, and in one embodiment as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18*.

Channel material 36 as a channel-material string 53 has been formed in channel openings 25 elevationally along insulative tiers 20 and conductive tiers 22 in memory-block regions 58. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 or may occur with respect to only some. Alternately, and by way of example only, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Referring to FIGS. 14 and 15, and in one embodiment as shown, TAV openings 84 have been etched through upper portion 18U of stack 18* and that are individually in individual of horizontal locations 85 where the individual TAVs will be formed. Metal material 77 of lowest first tier 22z is used as an etch-stop during such etching in one embodiment. TAV openings 84 may taper radially-inward or radially-outward moving deeper into stack 18* (neither being shown).

Referring to FIGS. 16 and 17, and in one embodiment as shown, an insulative lining 81 (e.g., hafnium oxide, aluminum oxide, multiple layers of silicon dioxide and silicon nitride, etc.) has been formed inside individual TAV openings 84 and has a lowest surface 89 that is directly against metal material 77 in lowest conductive tier 22z. Thereafter, punch etching has been conducted through insulative lining 81, followed by optional etching of TAV openings 84 deeper into construction 10 (e.g., using some different chemistry and/or conditions to etch through metal material 77).

Figure 18:
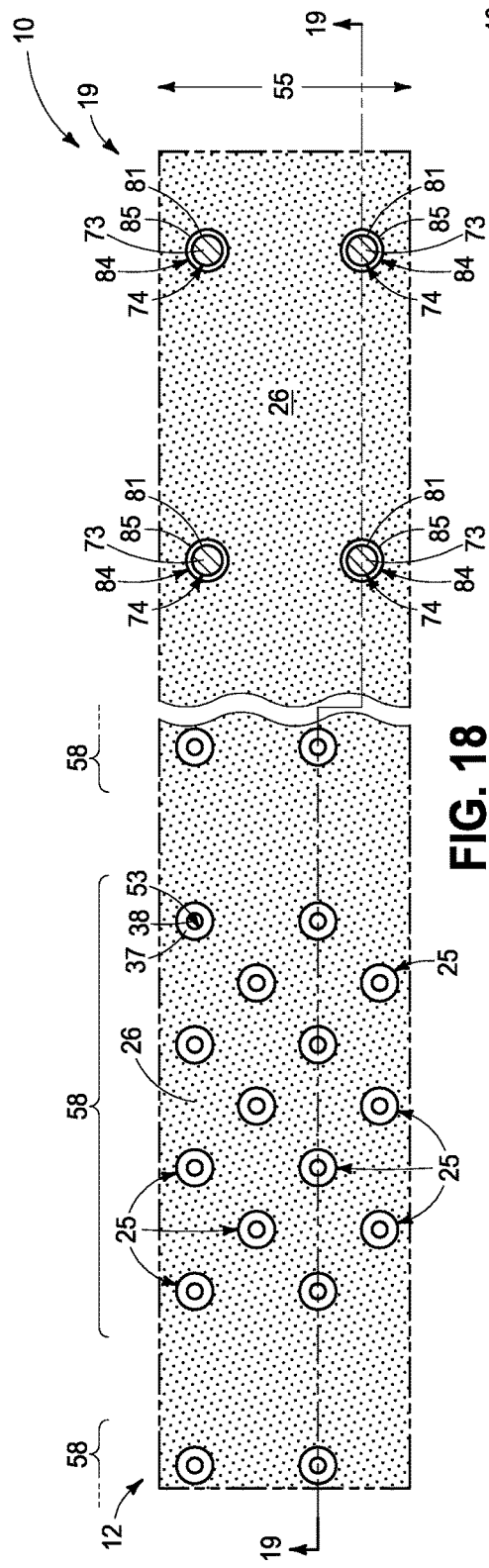
Figure 19:
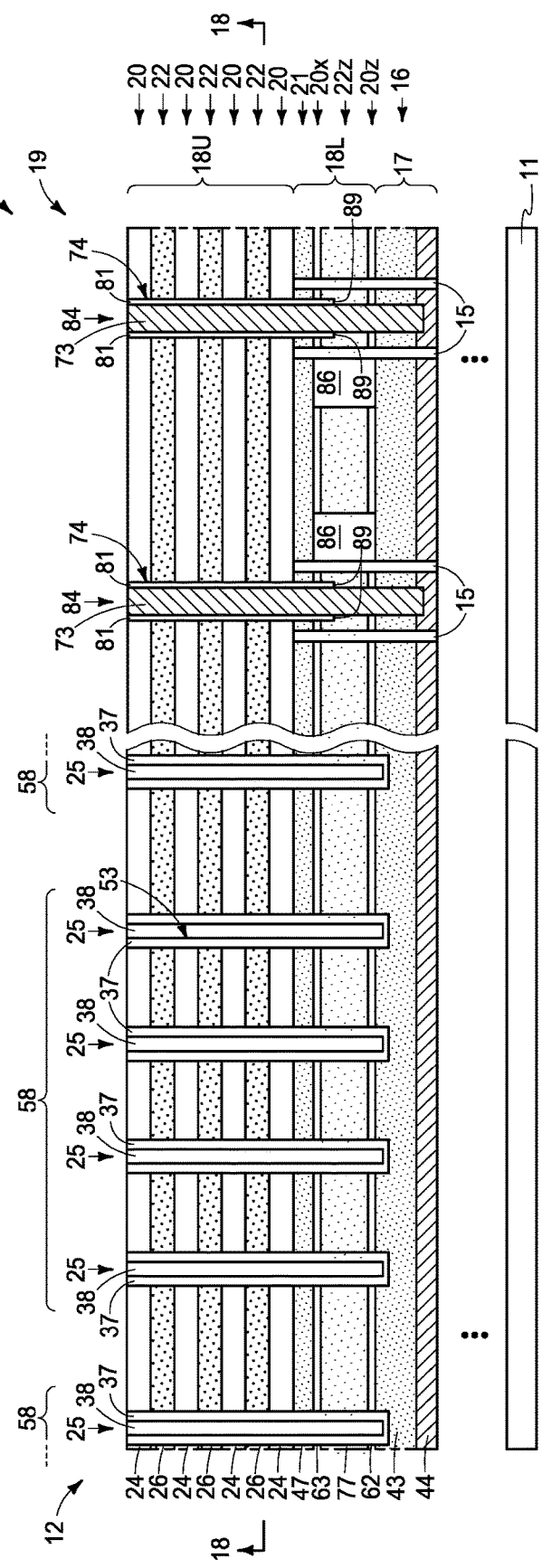

Referring to FIGS. 18 and 19, conductive material 73 (e.g., a Ti/TiN lining having W radially-inward thereof) has been formed to form individual TAVs 74 in individual TAV openings 84.

Figure 20:
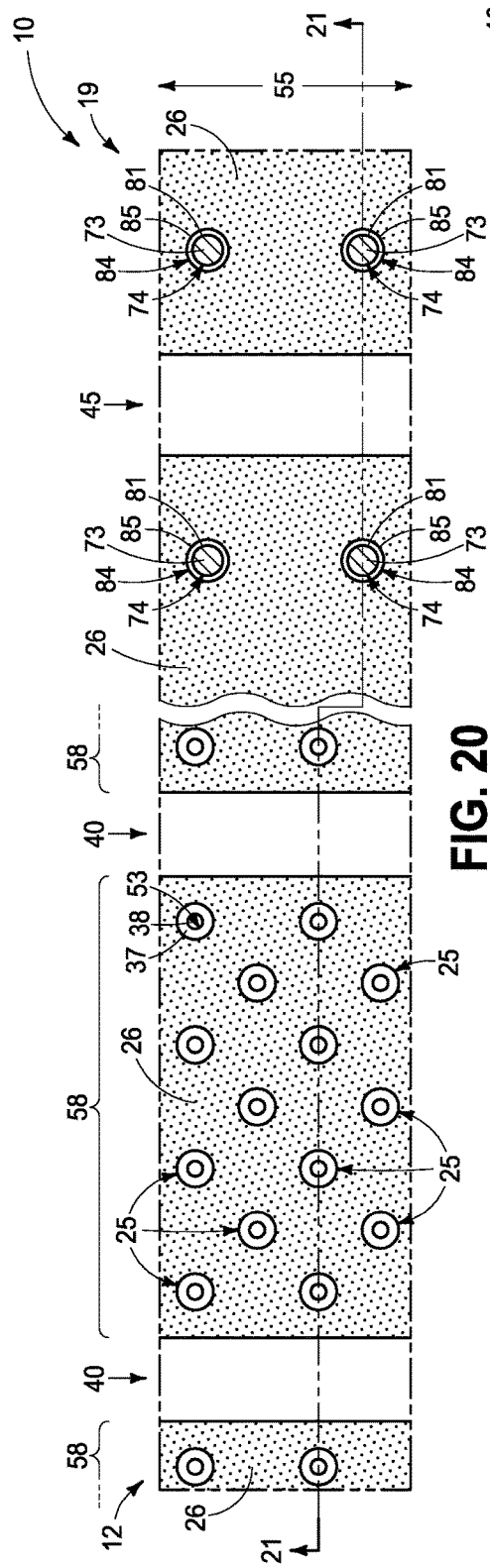
Figure 21:
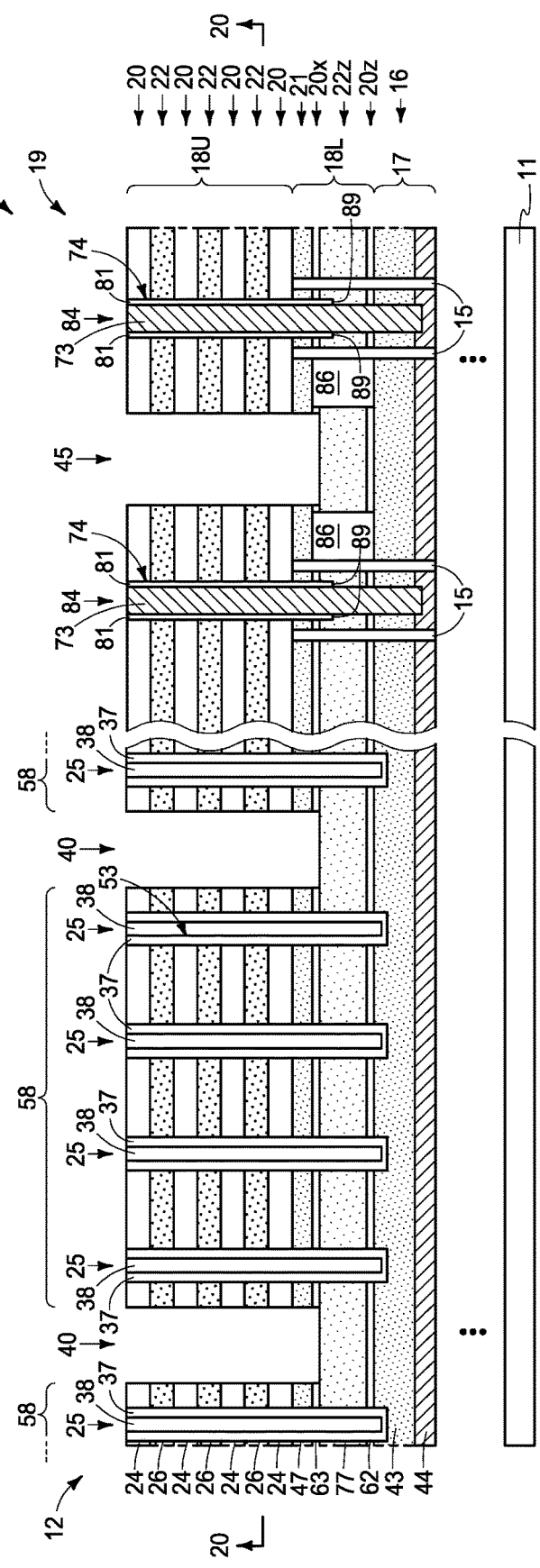

Referring to FIGS. 20 and 21, and in one embodiment as shown, horizontally-elongated trenches 40 have been etched through upper portion 18U of stack 18* between laterally-spaced memory-block regions 58 using metal material 77 of lowest first tier 22z as an etch-stop during such etching. In one embodiment, a trench 45 has been formed into upper portion 18U in TAV region between laterally-spaced walls 86 using metal material 77 of lowest first tier 22z as an etch-stop during such etching. Trenches 40 and/or 45 may taper laterally-inward or laterally-outward moving deeper into stack 18* (neither being shown).

Referring to FIGS. 22 and 23, an insulative lining 81 has been formed in trenches 40 and/or 45 and then punched there-through to expose material 77 there-below (e.g., metal material 77).

Figure 24:
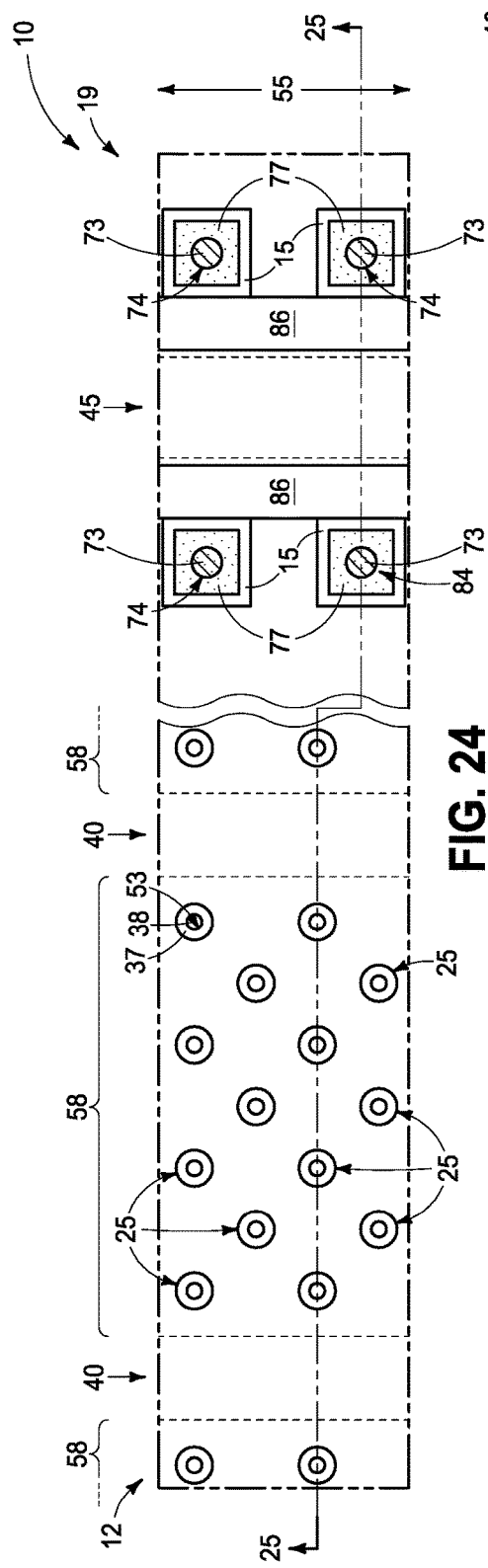
Figure 25:
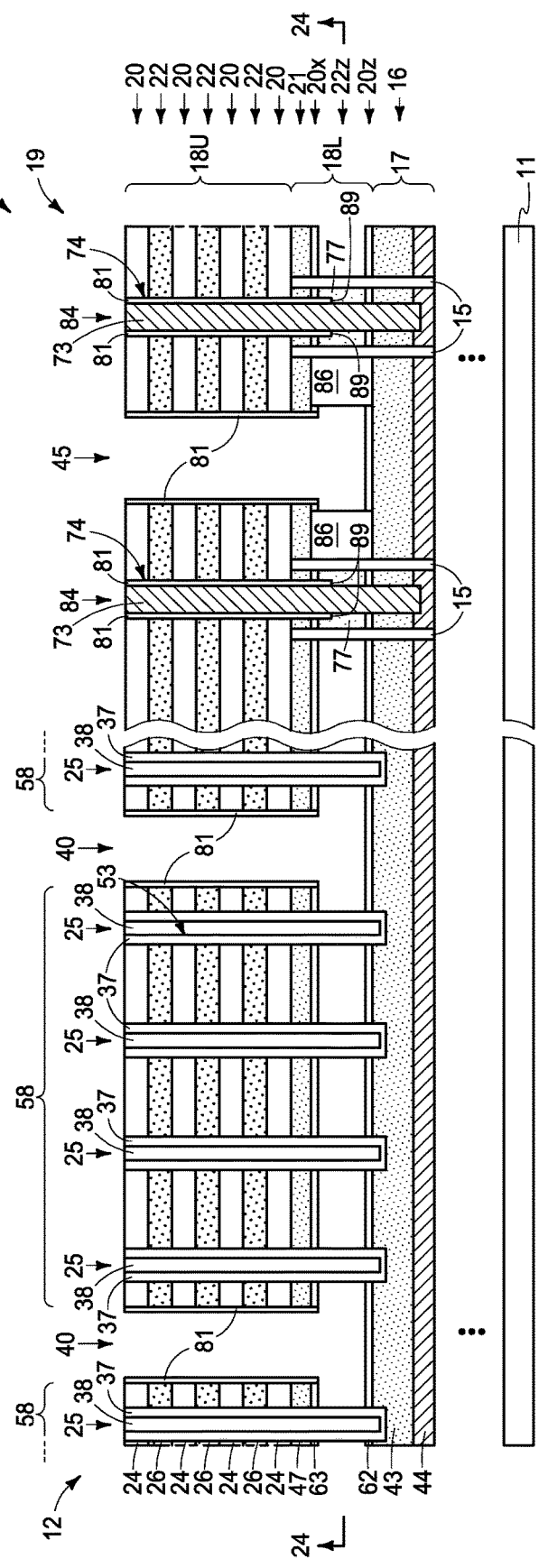

Referring to FIGS. 24 and 25, and in one embodiment, an etching fluid (not shown) has been flowed into horizontally-elongated trenches 40 and 45 to isotropically etch material 77 from lowest conductive tier 22z at least in array region 12 (material 77 thereby not being shown). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. Insulative lining 81 is ideally etch-resistant to the etching fluid used during the flowing. FIGS. 24 and 25 show an embodiment where material 77 has also been removed in TAV region 19 (material 77 thereby not being shown in TAV region 19 outside of insulative material 15). Whole, partial, or no removal of material 77 in TAV region may be dependent upon presence, size, number, and positioning of etch openings in TAV region 19 (e.g., trench opening[s]) 45). Walls 86 are also ideally etch-resistant to the etching fluid.

Figure 26:
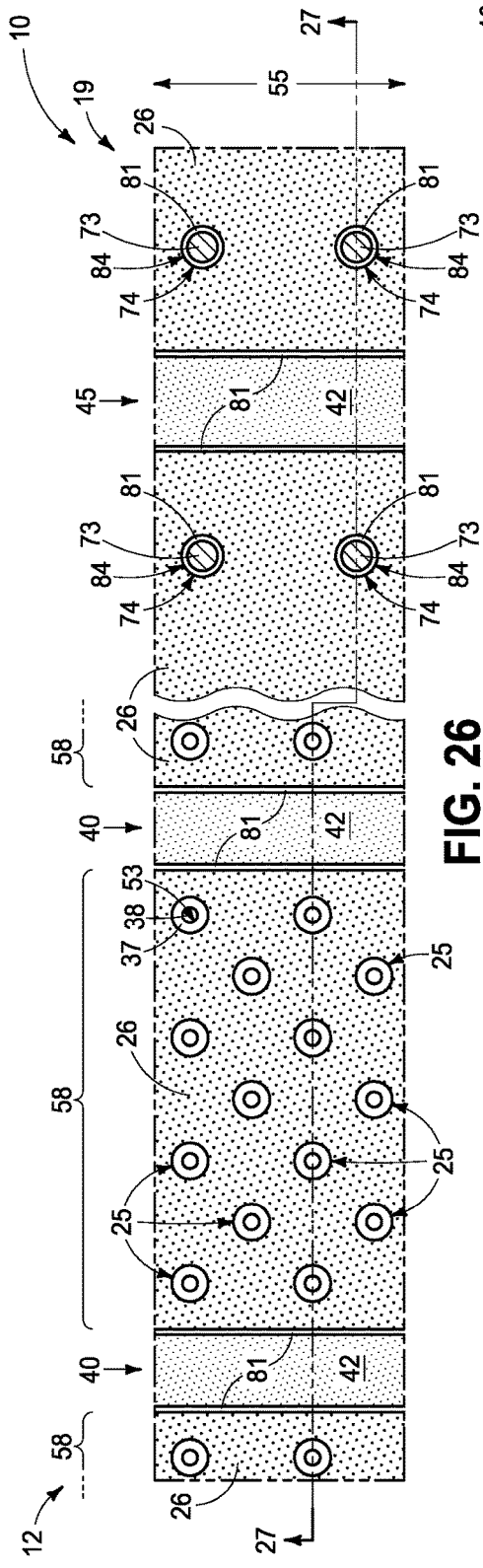
Figure 27:
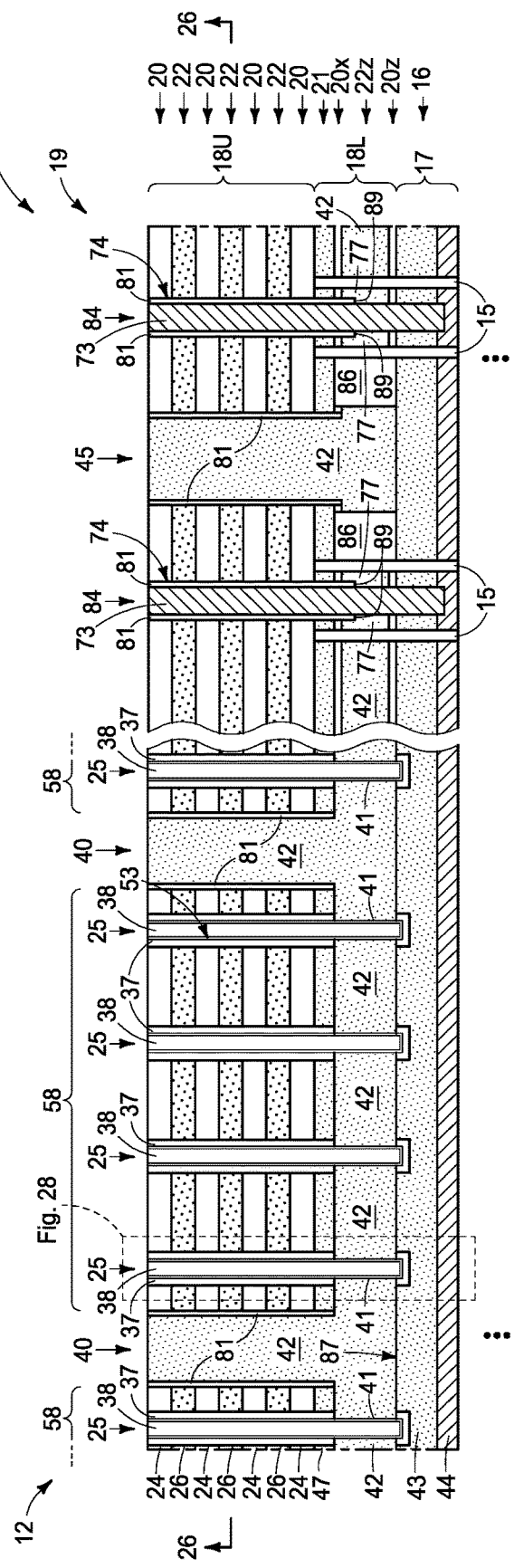
Figure 28:
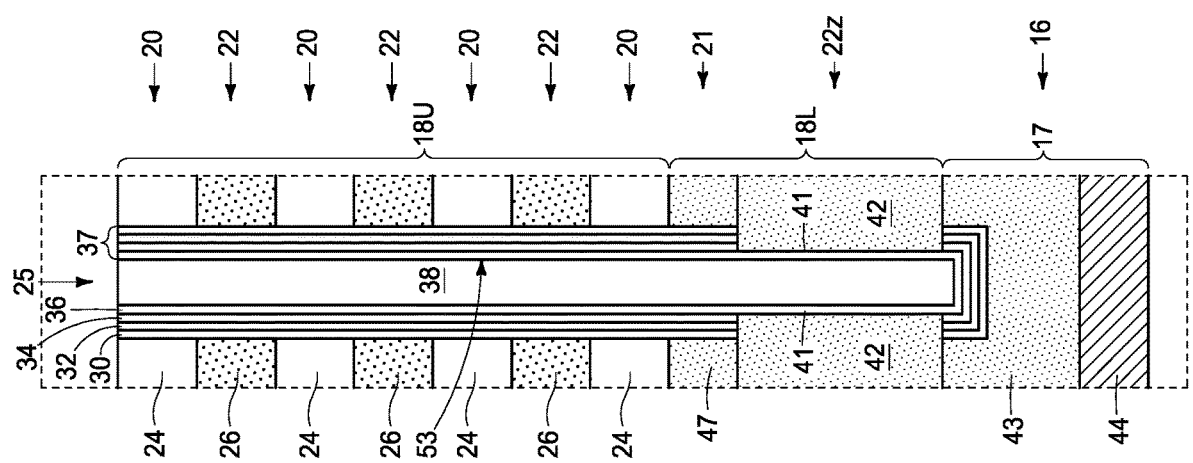

Referring to FIGS. 26-28, and in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. All, some, or none of materials 62 and 63 may also be removed in TAV region 19.

After exposing sidewall 41, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Figure 29:
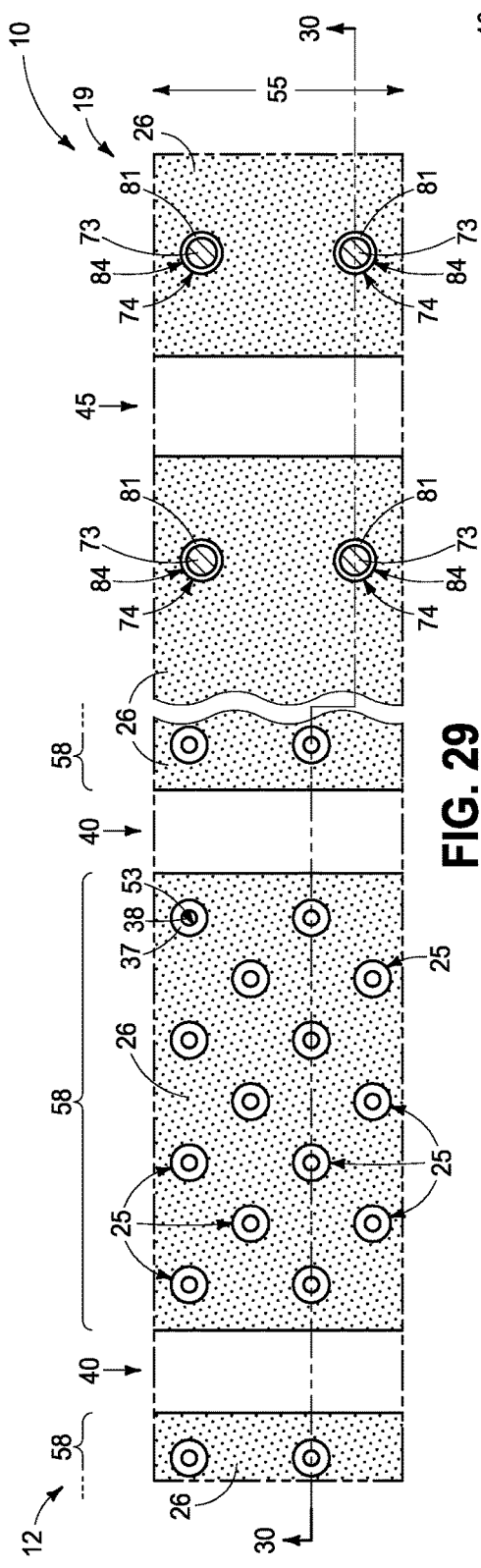
Figure 30:
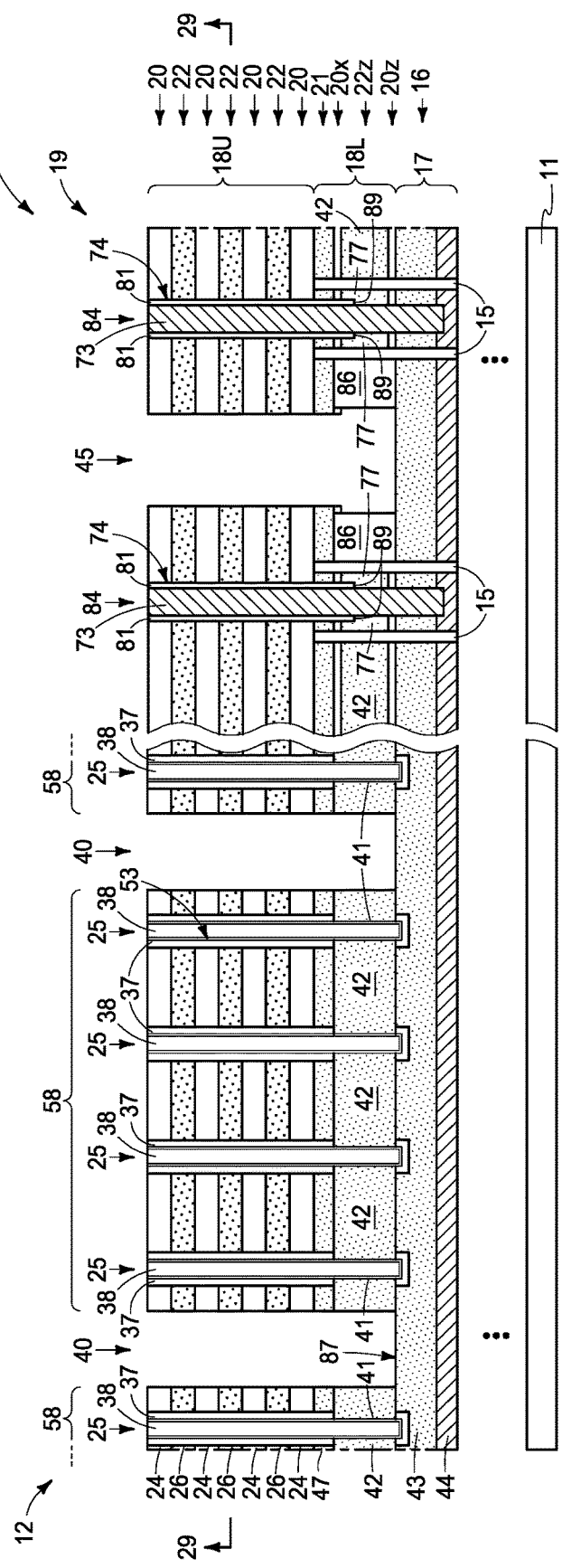
Figure 31:
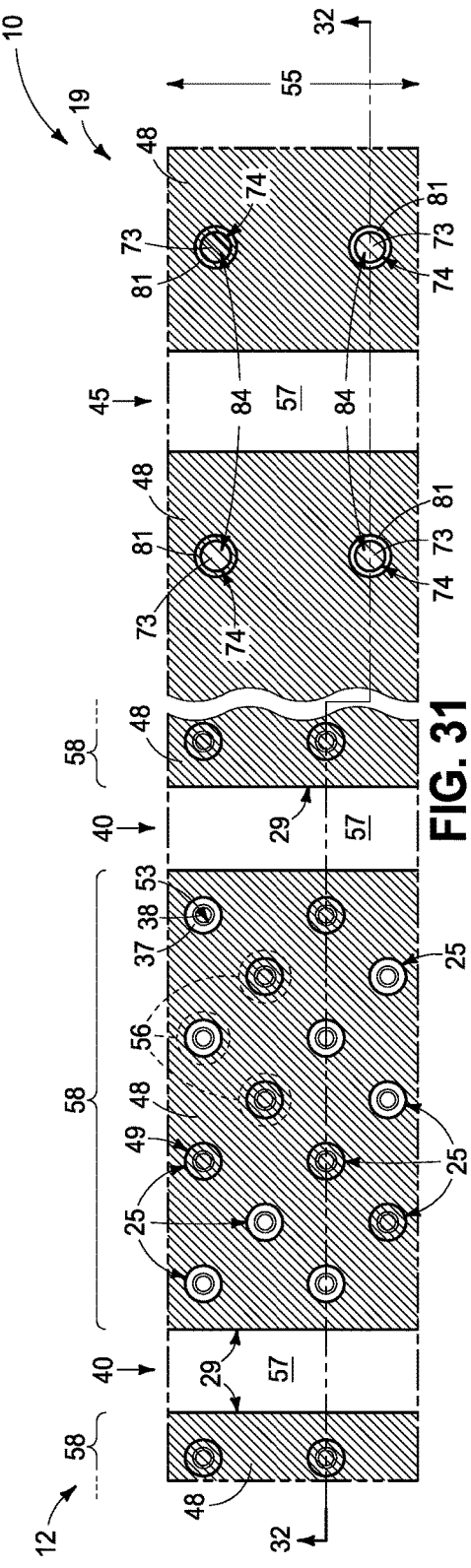
Figure 32:
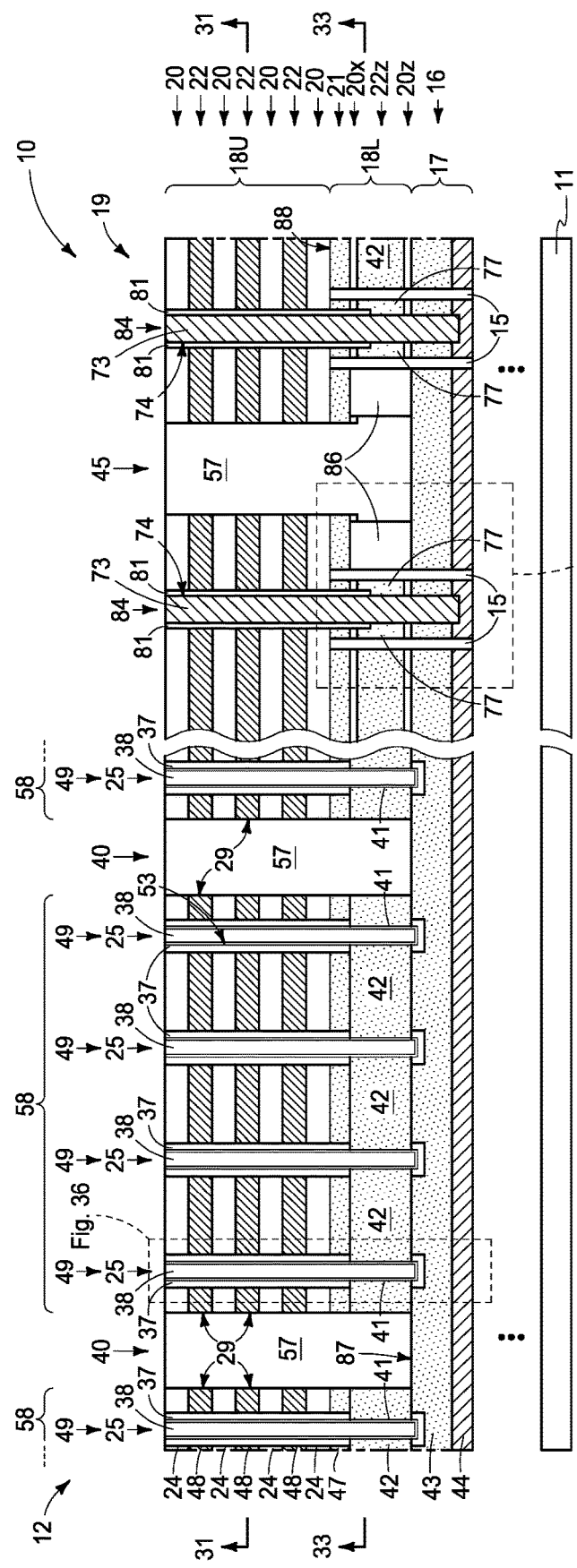
Figure 33:
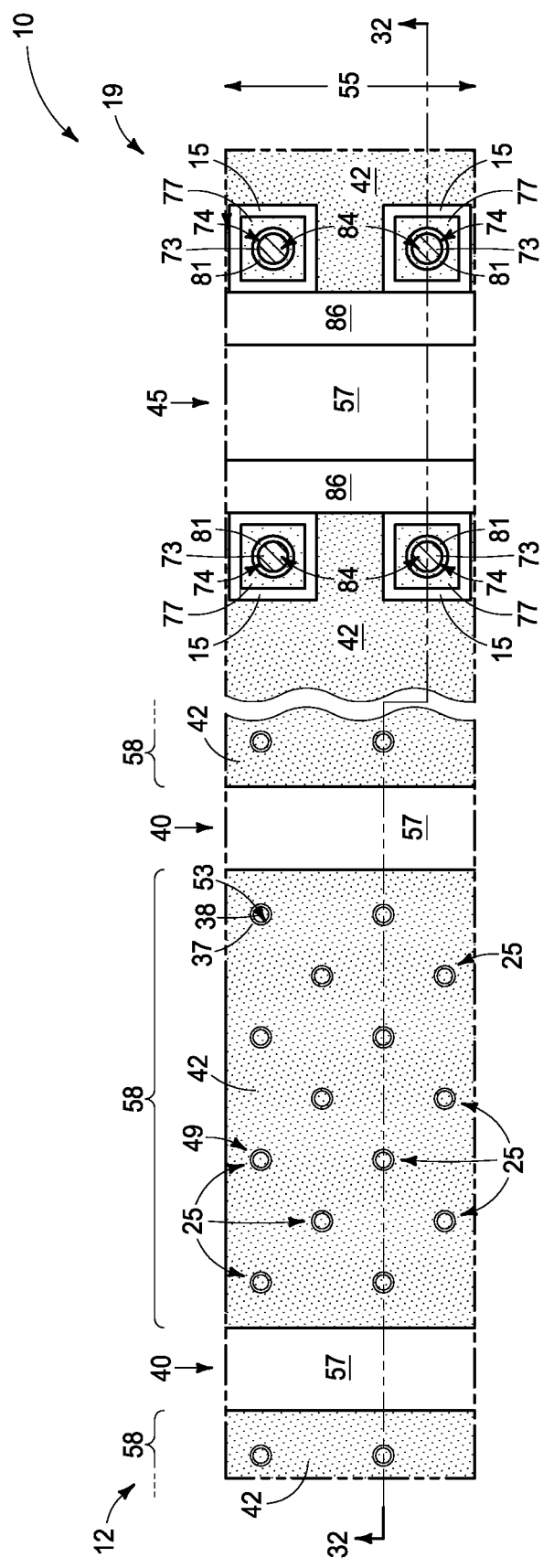
Figure 37:
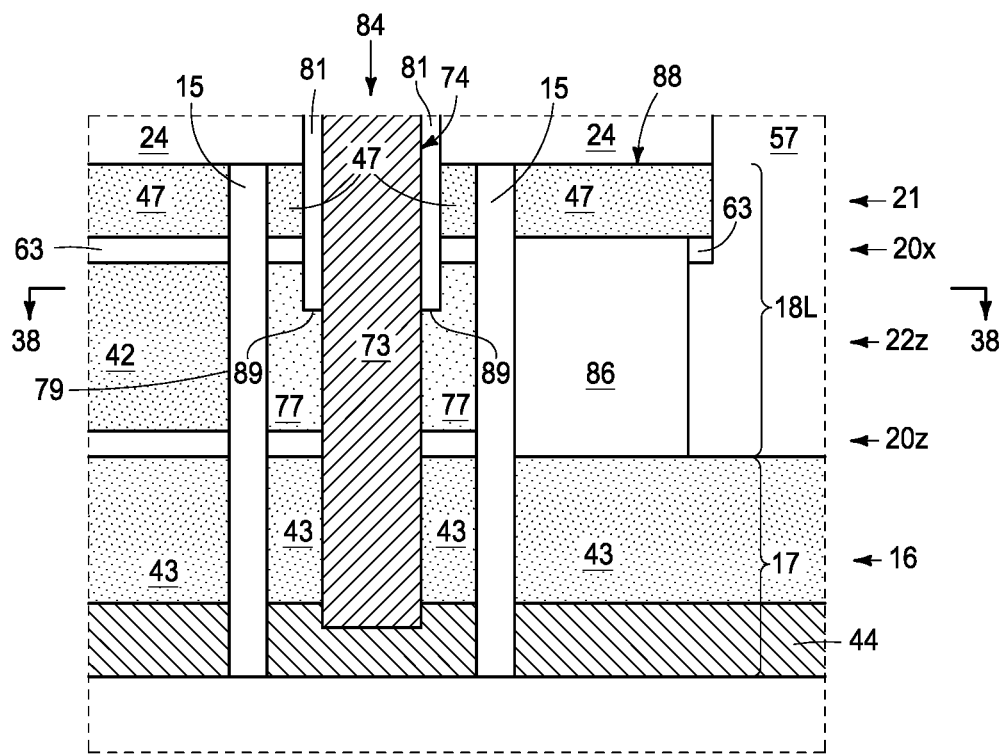
Figure 38:
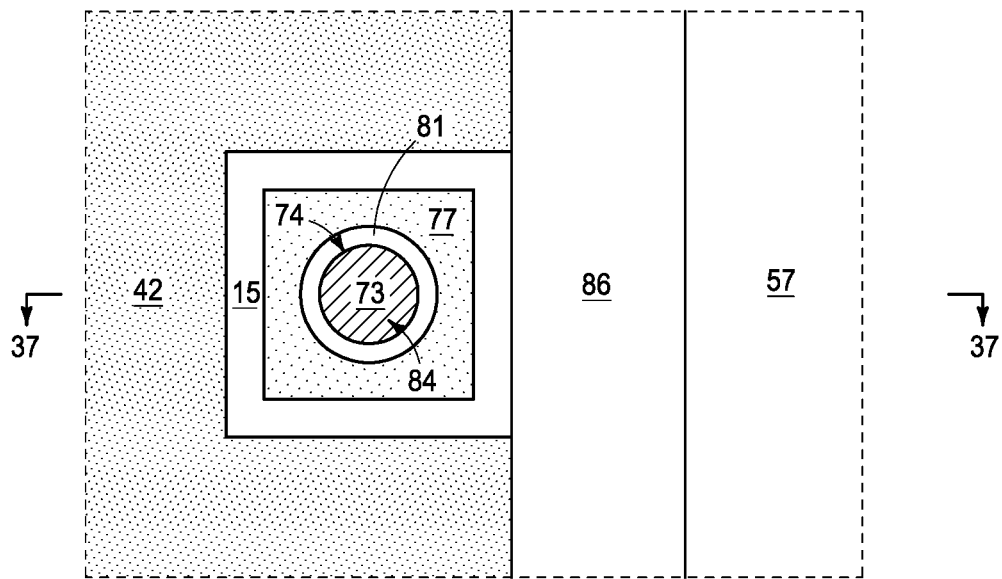

Referring to FIGS. 29 and 30, conductive material 42 has been removed from trenches 40 as has liner 81 (not there-shown). Liner 81 (when present and removed) may be removed before or after forming conductive material 42. Conductive material 42 and liner 81 have also been removed from trench 45 (when present, and in one such embodiment). In one embodiment as shown, conducting material 47 of tier 21 and conductive material 42 of tier 22z being directly against one another may collectively be considered as the lowest conductive tier at least in array region 12.

Referring to FIGS. 31-38, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (removal of all being shown) and replaced with conducting material 48, for example depending on proximity of trenches 40 that are closest thereto and/or presence or lack thereof of etch-blocking material(s)/structure(s) in tiers 22 in upper portion 18U (not shown) and presence of other openings (e.g., trench 45).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. In this document, "undoped" is a material having from 0 atoms/cm$^3$ to $1 \times 10^{12}$ atoms/cm$^3$ of atoms of conductivity-increasing impurity in said material. In this document, "doped" is a material having more than $1 \times 10^{12}$ atoms/cm$^3$ of atoms of conductivity-increasing impurity therein and "conductively-doped" is material having at least $1 \times 10^{18}$ atoms/cm$^3$ of atoms of conductivity-increasing impurity therein. Intervening material 57 may include through array vias (not shown). In one embodiment and as shown, intervening material 57 has also been formed in trench 45 when present.

Any other attribute(s) or aspect(s) as shown and/or described herein with respect to other embodiments may be used.

Figure 39:
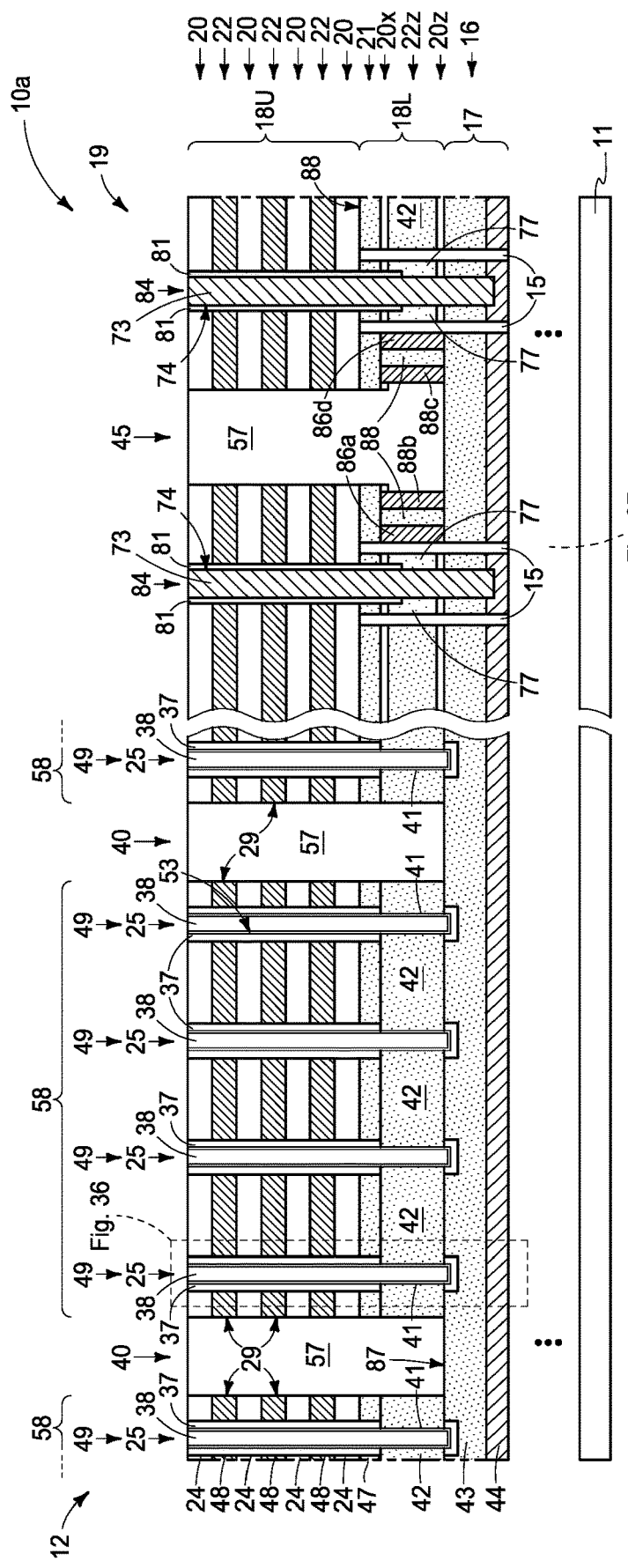

An alternate example construction 10a and method is next described with respect to FIG. 39. Like numerals from the above-described embodiments have been used where appropriate, with some construction differences being indicated with the suffixes "a", "b", "c", and "d", or with different numerals. FIGS. 2-38 show an example embodiment wherein laterally-spaced walls 86 extend vertically above and vertically below lowest first tier 22z. In construction 10a in FIG. 39, laterally-spaced walls 86a, 86b, 86c, and 86d do not extend vertically above lowest first tier 22z and do not extend vertically below lowest first tier 22z. For example, and by way of example only, consider an embodiment where laterally-spaced walls 86* comprise a metal silicide. One method used in forming construction 10a comprises forming an opening through lowest first tier 22z (e.g., such opening[s] individually being of the same size and shape as a silicon 88 shown between walls 86a and 86b and between walls 86c and 86d). Silicon (e.g., 88) is thereafter formed in the opening laterally-against sidewalls of metal material of the opening (e.g., metal material 77 of FIGS. 2 and 3). Such silicon is reacted with metal of metal material 77 to form a pair of laterally-spaced walls (e.g., one of the pair being walls 86a/86b, the other of the pair being walls 86c/86d [e.g., each wall of the pair itself being another pair of walls]) that comprise a metal silicide comprising the metal and the silicon. Any other attribute(s) or aspect(s) as shown and/or described herein with respect to other embodiments may be used.

It can be challenging when etching channel openings 25, TAV openings 84, trenches 40, and/or trenches 45 to stop such etching at desired elevations in the construction being fabricated. Isolated etch-stop structures (e.g., plugs/pillars and/or lines/rails) have been used for this purpose. Use of metal material as described herein may eliminate other separate fabrication of such etch-stop structures and may thereby reduce cost and/or improve or ease critical dimension and alignment of channel openings, TAV openings, and/or trenches.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A TAV region (e.g., 19) comprises TAVs (e.g., 74) that individually extend through a lowest of the conductive tiers (e.g., 22z). A pair of laterally-spaced walls (e.g., 86) (e.g., 86a/86b, 86c/86d) in the TAV region extend vertically through the lowest conductive tier. The walls are horizontally-elongated (e.g., along direction 55) along multiple of the TAVs. None of the TAVs is laterally-between the laterally-spaced walls of the pair. A horizontally-elongated intervening wall is in the TAV region in the lowest conductive tier between the pair of laterally-spaced walls (e.g., a wall comprising material 57 in trench 45). Any other attribute(s) or aspect(s) as shown and/or described herein with respect to other embodiments may be used.

In one embodiment, a memory array (e.g., 12) comprising strings (e.g., 49) of memory cells (e.g, 56) comprises laterally-spaced memory blocks (e.g., 58) individually comprising a vertical stack (e.g., 18*) comprising alternating insulative tiers (e.g, 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A through-array-via (TAV) region (e.g., 19) comprises TAV constructions (e.g., 74 in combination with insulative lining 81) that individually extend through a lowest of the conductive tiers (e.g., 22z). The TAV constructions individually comprise an insulative lining (e.g., 81) having a lowest surface (e.g., 89) that is directly against metal material (e.g., 77) in the lowest conductive tier. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed.

"Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a lower portion of a stack that will comprise vertically-alternating first tiers and second tiers directly above a conductor tier. The stack comprises laterally-spaced memory-block regions and a through-array-via (TAV) region. A lowest of the first tiers comprises metal material. Insulative material is formed vertically through the lower portion of the stack in the TAV region circumferentially around horizontal locations where individual TAVs will be formed. The vertically-alternating first tiers and second tiers of an upper portion of the stack are formed directly above the lower portion of the stack and the insulative material. Through the upper portion of the stack, channel openings are etched in the laterally-spaced memory-block regions. Horizontally-elongated trenches are formed between the laterally-spaced memory-block regions, and TAV openings that are individually in individual of the horizontal locations where the individual TAVs will be formed. The metal material of the lowest first tier is used as an etch-stop during the etching. Individual of the TAVs are formed in individual of the TAV openings. Intervening material is formed in the horizontally-elongated trenches and a channel-material string is formed in individual of the channel openings that directly electrically couples to conductor material in the conductor tier.

In some embodiments, a method used in forming a memory array comprising strings of memory cells comprises forming a lower portion of a stack that will comprise vertically-alternating first tiers and second tiers directly above a conductor tier. The stack comprises laterally-spaced memory-block regions and a through-array-via (TAV) region. A pair of laterally-spaced walls are formed in the TAV region that extend vertically through a lowest of the first tiers. The walls are horizontally-elongated along multiple horizontal locations where individual TAVs will be formed. None of the multiple horizontal locations are laterally-between the laterally-spaced walls of the pair. The vertically-alternating first tiers and second tiers of an upper portion of the stack are formed directly above the lower portion of the stack. Individual of the TAVs are formed through the upper portion to the lower portion in individual of the horizontal locations in the TAV region. Horizontally-elongated intervening material is formed through the upper portion to the lowest first tier and between the pair of laterally-spaced walls in the TAV region. Channel-material strings are formed in the laterally-spaced memory-block regions and that directly electrically couple to conductor material in the conductor tier.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAVs that individually extend through a lowest of the conductive tiers. A pair of laterally-spaced walls in the TAV region extend vertically through the lowest conductive tier. The walls are horizontally-elongated along multiple of the TAVs. None of the TAVs are laterally-between the laterally-spaced walls of the pair. A horizontally-elongated intervening wall is in the TAV region in the lowest conductive tier between the pair of laterally-spaced walls.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAV constructions that individually extend through a lowest of the conductive tiers. The TAV constructions individually comprise an insulative lining having a lowest surface that is directly against metal material in the lowest conductive tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a lower portion of a stack that will comprise vertically-alternating first tiers and second tiers directly above a conductor tier, the stack comprising laterally-spaced memory-block regions and a through-array-via (TAV) region, a lowest of the first tiers comprising metal material;
    forming insulative material vertically through the lower portion of the stack in the TAV region circumferentially around horizontal locations where individual TAVs will be formed;
    forming the vertically-alternating first tiers and second tiers of an upper portion of the stack directly above the lower portion of the stack and the insulative material;
    through the upper portion of the stack, etching channel openings in the laterally-spaced memory-block regions, horizontally-elongated trenches between the laterally-spaced memory-block regions, and TAV openings that are individually in individual of the horizontal locations where the individual TAVs will be formed; using the metal material of the lowest first tier as an etch-stop during the etching; and forming individual of the TAVs in individual of the TAV openings, forming intervening material in the horizontally-elongated trenches, and forming a channel-material string in individual of the channel openings that directly electrically couples to conductor material in the conductor tier.

2. The method of claim 1 wherein the metal material is insulative.

3. The method of claim 2 wherein the metal material comprises an aluminum oxide.

4. The method of claim 1 wherein the metal material is conductive.

5. The method of claim 1 wherein the metal material is semiconductive.

6. The method of claim 1 wherein the metal material comprises a metal oxide.

7. The method of claim 1 wherein the metal material comprises a metal nitride.

8. The method of claim 1 wherein the metal material comprises elemental-form metal.

9. The method of claim 1 wherein the metal material comprises a metal silicide.

10. The method of claim 1 comprising forming the insulative material through the conductor tier.

11. The method of claim 1 comprising forming a pair of laterally-spaced walls in the TAV region that extend vertically through the lowest first tier, the walls being horizontally-elongated along multiple of the horizontal locations where individual TAVs will be formed, none of the multiple horizontal locations being laterally-between the laterally-spaced walls of the pair, the walls being of different composition from that of the metal material.

12. The method of claim 11 wherein the laterally-spaced walls extend vertically above and vertically below the lowest first tier.

13. The method of claim 11 wherein the laterally-spaced walls do not extend vertically above the lowest first tier and do not extend vertically below the lowest first tier.

14. The method of claim 11 wherein the laterally-spaced walls comprise a metal silicide, the forming of the pair of laterally-spaced walls comprising:
forming an opening through the lowest first tier;
forming silicon in the opening laterally-against sidewalls of the metal material of the opening; and
reacting the silicon with metal of the metal material to form the pair of laterally-spaced walls that comprise a metal silicide comprising the metal and the silicon.

15. The method of claim 1 comprising:
forming the TAVs to extend through the lowest first tier; and
forming an insulative lining individually around and vertically along the individual TAVs, the insulative lining having a lowest surface that is directly against the metal material in the lowest conductive tier.

16. A method used in forming a memory array comprising strings of memory cells, comprising:
forming a lower portion of a stack that will comprise vertically-alternating first tiers and second tiers directly above a conductor tier, the stack comprising laterally-spaced memory-block regions and a through-array-via (TAV) region;

forming a pair of laterally-spaced walls in the TAV region that extend vertically through a lowest of the first tiers, the walls being horizontally-elongated along multiple horizontal locations where individual TAVs will be formed, none of the multiple horizontal locations being laterally-between the laterally-spaced walls of the pair;

forming the vertically-alternating first tiers and second tiers of an upper portion of the stack directly above the lower portion of the stack; and forming individual of the TAVs through the upper portion to the lower portion in individual of the horizontal locations in the TAV region, forming horizontally-elongated intervening material through the upper portion to the lowest first tier and between the pair of laterally-spaced walls in the TAV region, and forming channel-material strings in the laterally-spaced memory-block regions and that directly electrically couple to conductor material in the conductor tier.

17. The method of claim 16 wherein the laterally-spaced walls extend vertically above and vertically below the lowest first tier.

18. The method of claim 16 wherein the laterally-spaced walls do not extend vertically above the lowest first tier and do not extend vertically below the lowest first tier.

19. The method of claim 16 wherein the laterally-spaced walls comprise a metal silicide, the forming of the pair of laterally-spaced walls comprising:
forming an opening through the lowest first tier;
forming silicon in the opening laterally-against sidewalls of the metal material of the opening; and
reacting the silicon with metal of the metal material to form the pair of laterally-spaced walls that comprise a metal silicide comprising the metal and the silicon.

20. A memory array comprising strings of memory cells, comprising:
laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier;
a through-array-via (TAV) region comprising TAVs that individually extend through a lowest of the conductive tiers;
a pair of laterally-spaced walls in the TAV region extending vertically through the lowest conductive tier, the walls being horizontally-elongated along multiple of the TAVs, none of the TAVs being laterally-between the laterally-spaced walls of the pair; and
a horizontally-elongated intervening wall in the TAV region in the lowest conductive tier between the pair of laterally-spaced walls.

21. The memory array of claim 20 wherein the laterally-spaced walls extend vertically above and vertically below the lowest first tier.

22. The memory array of claim 20 wherein the laterally-spaced walls do not extend vertically above the lowest first tier and do not extend vertically below the lowest first tier.

23. A memory array comprising strings of memory cells, comprising:
laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier; and a through-array-via (TAV) region comprising TAV constructions that individually extend through a lowest of the conductive tiers, the TAV constructions individually comprising an insulative lining having a lowest surface that is directly against metal material in the lowest conductive tier.

24. The memory array of claim 23 wherein the metal material is insulative.

25. The memory array of claim 24 wherein the metal material comprises an aluminum oxide.

26. The memory array of claim 23 wherein the metal material is conductive.

27. The memory array of claim 23 wherein the metal material is semiconductive.

28. The memory array of claim 23 wherein the metal material comprises a metal oxide.

29. The memory array of claim 23 wherein the metal material comprises a metal nitride.

30. The memory array of claim 23 wherein the metal material comprises elemental-form metal.

31. The memory array of claim 23 wherein the metal material comprises a metal silicide.

* * * * *